United States Patent
Yonehara et al.

(10) Patent No.: US 8,415,230 B2
(45) Date of Patent: Apr. 9, 2013

(54) METHOD FOR TRANSFERRING FUNCTIONAL REGIONS, LED ARRAY, LED PRINTER HEAD, AND LED PRINTER

(75) Inventors: Takao Yonehara, Atsugi (JP); Yasuyoshi Takai, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/254,024

(22) PCT Filed: Mar. 1, 2010

(86) PCT No.: PCT/JP2010/001379
§ 371 (c)(1),
(2), (4) Date: Aug. 31, 2011

(87) PCT Pub. No.: WO2010/100882
PCT Pub. Date: Sep. 10, 2010

(65) Prior Publication Data
US 2011/0311276 A1    Dec. 22, 2011

(30) Foreign Application Priority Data

Mar. 4, 2009 (JP) ................................ 2009-050012

(51) Int. Cl.
*H01L 21/30* (2006.01)
*H01L 21/46* (2006.01)

(52) U.S. Cl. ............. 438/458; 438/456; 438/26; 438/47; 438/483; 257/E21.211; 257/E27.12

(58) Field of Classification Search ............. 438/26–34, 438/47, 238, 455, 458; 257/79, 277, 618, 257/E21.22, E21.211, E21.122, E23.141, 257/E27.121
See application file for complete search history.

(56) References Cited

U.S. PATENT DOCUMENTS

| | | |
|---|---|---|
| 5,042,709 A | 8/1991 | Cina |
| 6,204,079 B1 | 3/2001 | Aspar |
| 6,800,871 B2 | 10/2004 | Matsuda |
| 6,913,985 B2 | 7/2005 | Ogihara |
| 2004/0048447 A1 | 3/2004 | Kondo |

FOREIGN PATENT DOCUMENTS

| | | |
|---|---|---|
| EP | 1420456 A1 | 5/2004 |
| JP | 2000-153420 A | 6/2000 |
| JP | 2003-174041 A | 6/2003 |
| JP | 2003-258210 A | 9/2003 |
| JP | 2004-311765 A | 11/2004 |

(Continued)

*Primary Examiner* — Charles Garber
*Assistant Examiner* — Abdulfattah Mustapha
(74) *Attorney, Agent, or Firm* — Canon U.S.A., Inc., IP Division

(57) ABSTRACT

Provided is a method for transferring, onto a second substrate, at least one of functional regions arranged and joined to a first separation layer that is disposed on a first substrate and that becomes separable by a treatment, in which regions on the second substrate where the functional regions are to be transferred have a second separation layer that becomes separable by a treatment. The method includes a step of joining the first substrate to the second substrate by bonding such that the functional regions contact the second separation layer; a step of separating the functional regions from the first substrate at the first separation layer; and a step of, before or after the step of separation, forming separation grooves penetrating through the second substrate and the second separation layer from a surface of the second substrate, the surface being opposite to a surface having the second separation layer thereon.

11 Claims, 20 Drawing Sheets

FOREIGN PATENT DOCUMENTS

| | | |
|---|---|---|
| JP | 2005-012034 A | 1/2005 |
| JP | 2006-53171 A | 2/2006 |
| WO | 2008050901 A1 | 5/2008 |
| WO | WO 2008050901 A1 * | 5/2008 |

* cited by examiner

METHOD FOR TRANSFERRING FUNCTIONAL REGIONS, LED ARRAY, LED PRINTER HEAD, AND LED PRINTER

TECHNICAL FIELD

The present invention relates to a method for transferring functional regions for manufacturing semiconductor components, semiconductor articles, semiconductor devices, or the like. Also, the present invention relates to a light-emitting diode (LED) array, an LED printer head, an LED printer head, and the like produced by the method.

BACKGROUND ART

A technique is known in which a light-emitting-diode-constituting layer deposited on a GaAs substrate, with a sacrificial layer therebetween, is transferred (also referred to as "moved") to a silicon substrate.

Patent Literature 1 describes a technique in which a light-emitting-diode-constituting layer is transferred onto a silicon substrate. Specifically, a sacrificial layer is formed on a GaAs substrate, and a light-emitting-diode-constituting layer is formed on the sacrificial layer. Subsequently, grooves for dividing the light-emitting-diode-constituting layer into a plurality of light-emitting regions are formed through the light-emitting-diode-constituting layer. The sacrificial layer is exposed right under the grooves. Next, a dry film resist is applied onto the light-emitting-diode-constituting layer, and a mesh-like supporting member composed of a metal wire is further bonded to the dry film resist. Thus, a bonded structure is prepared.

Subsequently, portions of the resist other than portions located right under the metal wire are removed. Furthermore, an etchant is brought into contact with the sacrificial layer through the mesh-like supporting member to etch the sacrificial layer, thus separating the GaAs substrate from the bonded structure. Furthermore, after the separation of the GaAs substrate, the light-emitting-diode-constituting layer is bonded to a silicon substrate. Thus, the light-emitting-diode-constituting layer is transferred (moved) onto the silicon substrate.

CITATION LIST

Patent Literature

PTL 1: U.S. Pat. No. 6,913,985

SUMMARY OF INVENTION

Technical Problem

In the case where an LED array or the like is produced using a compound semi-conductor such as GaAs on a GaAs substrate as a light-emitting layer, the GaAs substrate used is very expensive compared with a silicon substrate and thus an efficient use of such a GaAs substrate has been desired. In addition, when the size of a GaAs substrate (e.g., 2-, 4-, or 6-inch substrate) is different from the size of a silicon substrate (e.g., 4-, 5-, 6-, 8-, 12-, or 18-inch substrate) and a transfer is performed at one time in units of substrates, regions that can be transferred correspond to regions of the substrate having a smaller diameter. Accordingly, in order to efficiently perform the transfer, there is a limitation that it is necessary to adjust the diameters of the two substrates to the size of the substrate having a smaller diameter. Therefore, it is difficult to adopt a substrate which has a large size and a low cost per unit area.

In addition, when the transfer disclosed in Patent Literature 1 is performed, only portions of the GaAs semiconductor layer corresponding to portions of devices formed on the transfer destination silicon substrate can be effectively used, and other portions of GaAs semiconductor which are located between the devices and in which the devices are not present are disposed of without being used.

This problem will be further described with reference to the drawings. FIG. 20A shows circuit elements formed on a silicon substrate and FIG. 20B shows light-emitting layers formed on a GaAs substrate. Referring to FIG. 20B, light-emitting layers 12 composed of GaAs are formed on a GaAs substrate 11. Referring to FIG. 20A, circuit elements 14 are formed on a silicon substrate 13. Light-emitting devices are produced by transferring the light-emitting layers 12 onto the circuit elements 14. Each of the light-emitting layers 12 is provided on a part of the corresponding circuit element 14 (or provided so as to be adjacent to the corresponding circuit element 14). Here, the size (L×W) of each light-emitting layer 12 is, for example, about 8 millimeters in length and about 50 micrometers in width. On the other hand, the size (L×W) of each circuit element 14 is, for example, about 10 millimeters in length and about 0.3 millimeters in width. Accordingly, in the case where the light-emitting layers 12 are transferred onto the circuit elements 14 at one time, the arrangement of the light-emitting layers 12 and the number of light-emitting layers 12 to be arranged are limited by the arrangement of the circuit elements 14. As a result, the area that can be used as the light-emitting layers 12 per unit area of the GaAs substrate 11 is small.

Furthermore, as described above, the size of GaAs substrates used as seed substrates is at most about 6 inches. In contrast, as for the size of silicon substrates used as transfer destination substrates, the area of the substrates has been increasing with the development of semiconductor technologies using the silicon substrates. At present, silicon substrates having a diameter of 12 inches (300 mm) are mainly used, however, the diameter of silicon substrates has been increasing to 18 inches (450 mm) Under these technical situations, such a significant difference in the diameter of these substrates makes it difficult to efficiently use a silicon substrate having a large area and to efficiently transfer functional regions from a seed substrate to a transfer destination substrate.

In view of the above problem, the present invention provides a method for transferring, onto a second substrate, at least one of functional regions arranged on a first separation layer (also referred to as "release layer") that is disposed on a first substrate and that becomes separable by a treatment, the method having the following features: Regions on the second substrate where the functional regions are to be transferred have a second separation layer that becomes separable by a treatment, and a first step to a third step described below are performed. In the first step, the first substrate is joined to the second substrate by bonding such that the functional regions are in contact with the second separation layer. In the second step, the functional regions are separated from the first substrate at the first separation layer. In the third step, before or after the second step, separation grooves penetrating through the second substrate and the second separation layer are formed from a surface of the second substrate, the surface being opposite to a surface having the second separation layer thereon. Typically, in the third step, the separation grooves are formed in a state in which the first substrate is joined to the second substrate, and in the second step, the functional regions are separated from the first substrate by at least removing the first separation layer with an etchant introduced through the separation grooves.

Advantageous Effects of Invention

According to the transfer method of the present invention, functional regions can be transferred from a substrate to another substrate using, as a mediator, segments of the second substrate, the segments being divided by the separation grooves and having a desired size. Accordingly, the difficulty in efficiently transferring the functional regions due to the difference in size between the substrates used therefor can be overcome. Furthermore, for example, the utilization efficiency of a seed substrate such as a relatively expensive compound semiconductor substrate can be improved to reduce the cost. The yield in the transfer step can also be improved.

Furthermore, a high-performance LED array, LED printer head, LED printer, or the like can be provided at a low cost by employing the method for transferring functional regions of the present invention.

DESCRIPTION OF EMBODIMENTS

Figure 1A:
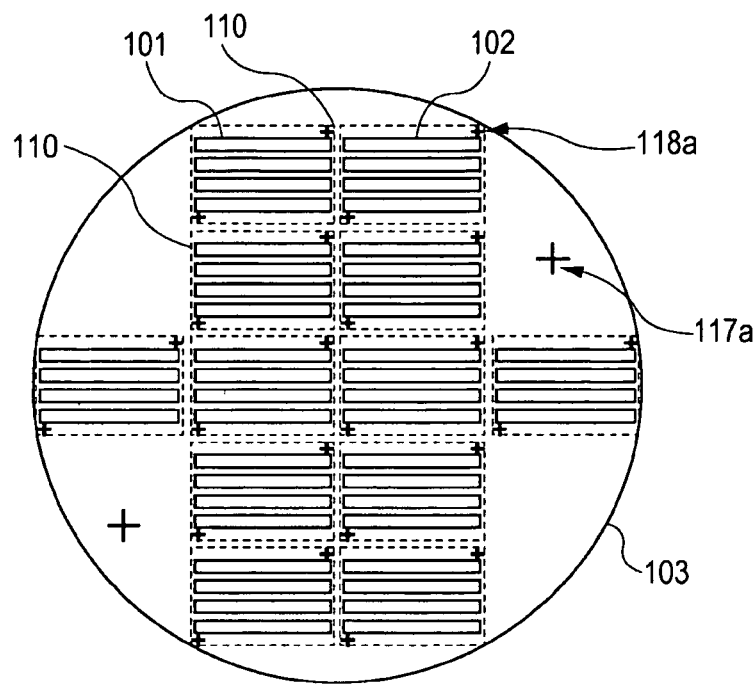
FIG. 1A is a plan view of a first substrate (e.g., seed substrate) used in a method for transferring functional regions according to an embodiment of the present invention.

In the present invention, the term "functional region" means a region having at least a semiconductor junction, and such a functional region may be a single-layer semi-conductor film or a device. Alternatively, the term "functional region" means a region that has a piezoelectric property, a dielectric property, a magnetic property, or the like and that has an electric or magnetic function, or the like so that the region can be used as a functional device, and such a functional region may be a device. In any case, it is important in the present invention that segments onto which functional regions have been transferred are prepared through a step of transferring the functional regions from a first substrate to a second substrate and a step of dividing the second substrate into the segments with separation grooves, and the functional regions are transferred onto a desired substrate using the segments as a mediating substrate. In the present invention, the term "segment" means a unit region in transferring the functional regions of the present invention or a substrate on which the unit region is disposed, and includes a predetermined number of functional regions. The division of a substrate or the transfer of functional regions is performed for every unit region. The number of functional regions included in one segment can be appropriately determined in accordance with the size of a substrate used as the transfer source or a substrate used as the transfer destination, the handleability of the segment in the manufacturing process, and the like. For example, the number may be determined in accordance with the arrangement of circuit elements of the final transfer destination. As for the number of functional regions included in one segment, for example, one segment may be constituted by 10 functional regions as a unit or one segment may be constituted by 100 functional regions as a unit. In addition, from one segment including a plurality of functional regions, all of or some of the functional regions can be transferred to another substrate.

Embodiments of the present invention will now be described. On the basis of the idea described above, in a basic embodiment according to a transfer method of the present invention, the following steps are performed in order to transfer, onto a second substrate, at least one of functional regions arranged and joined to a first separation layer (also referred to as "release layer") that is disposed on a first substrate and that becomes separable by a treatment. The first substrate is joined to the second substrate by bonding such that the functional regions are in contact with a second separation layer, and the functional regions are then separated from the first substrate at the first separation layer. Here, the second separation layer is a layer that becomes separable by a treatment and is provided on regions on the second substrate where the functional regions are to be transferred. In the present invention, the term "treatment" means a treatment that causes decomposition of a separation layer or a decrease in the bonding strength thereof and refers to a treatment in which energy such as heat, light, stress, or the like is provided to the separation layer, resulting in decomposition of the separation layer or a decrease in the bonding strength thereof. During this process, before or after the separation of the functional regions, separation grooves penetrating through the second substrate and the second separation layer are formed from a surface of the second substrate, the surface opposite to a surface having the second separation layer thereon, thus dividing the second substrate into segments. In the present invention, the first substrate may be a seed substrate, such as a compound semi-conductor substrate, on which functional regions are grown or another substrate to which functional regions have been transferred from such a seed substrate. In the former case, the first separation layer is typically, for example, an etching sacrificial layer described below. In the latter case, the first separation layer is typically, for example, a double-sided release tape described below.

The second substrate is a substrate (i.e., substrate that is divided into segment units in the course of a process) that mediates the transfer of functional regions to a substrate used as the final transfer destination. The material for the second substrate and the size thereof may be appropriately selected according to the purpose. For example, a relatively inexpensive transparent glass substrate or the like may be used so as to relatively easily form separation grooves and to easily align with another substrate. In the case where such an alignment (position adjustment), heat resistance, durability, mechanical strength, and the like are necessary, sapphire ($Al_2O_3$) or the like may be used. The separation grooves may be formed in a state in which the first substrate is joined to the second substrate, and the separation grooves may be used for separating the functional regions from the first substrate by at least removing the first separation layer serving as an etching sacrificial layer with an etchant introduced through the separation grooves. Alternatively, the separation of the functional regions from the first substrate at the first separation layer may be performed by another method such as spraying of a fluid, a light irradiation treatment or a heat treatment of the first separation layer described below, or the like. Thus, the separation grooves may be used only for the purpose of dividing the second substrate into segments. In this case, the separation grooves may be formed before or after the functional regions are separated from the first substrate.

Alternatively, for example, as for the functional regions, a plurality of regions may be arranged on the first substrate with predetermined interval regions therebetween, and the separation grooves provided through the second substrate may be formed at positions corresponding to at least a part of the interval regions disposed between the plurality of functional regions so as to divide the second substrate into segments. Alignment regions used for the alignment of substrates may be provided on the first separation layer of the first substrate, and the alignment regions may be transferred to the second substrate when the functional regions are transferred from the first substrate to the second substrate. In such a case, when the alignment regions have the same layer structure as the functional regions, the alignment regions can be easily prepared. In this case, these alignment regions can be used for the alignment of substrates when the functional regions are transferred from the second substrate to another substrate. Alternatively, alignment regions may be provided on the first substrate, and alignment regions corresponding to the alignment regions on the first substrate may be provided on the second substrate. Alternatively, in producing semiconductor devices using the method for transferring functional regions of the present invention, for some specifications of the desired semiconductor devices, the functional regions can be transferred without separately independently providing such alignment regions. For example, in producing an LED array using the method according to the present invention, when the resolution of the LED array is less than 600 dpi and the alignment tolerance is large to some degree, transfer can be performed as follows. Specifically, in transferring a functional region, the functional region, or a separation layer or joining layer (also referred to as "bonding layer") functioning as a base of the functional region is used as an alignment region, and a joining position is determined using the functional region, the separation layer, or the joining layer as a reference, thus transferring the functional region. In particular, the alignment can be performed using an edge portion of the functional region, the joining layer, or the separation layer as a reference.

As described above, the functional regions may be separated from the first substrate without using etching of a sacrificial layer, for example, as follows. In this case, in a step of forming an interface separating layer, an interface separating layer is heteroepitaxially grown on a seed substrate (first substrate). Next, in a step of forming a semiconductor layer, a compound semiconductor film is formed on the interface separating layer. In a step of joining, the seed substrate having the interface separating layer and the compound semiconductor layer thereon is joined to a second substrate provided with a separation layer (such as a double-sided release tape) containing materials which are decomposed or the bonding strengths of which are decreased under different conditions, with the separation layer therebetween. In a step of separation, the second substrate provided with the separation layer and the compound semiconductor film are separated from the resulting composite member formed by the step of joining using the interface separating layer. Thus, the second substrate having the compound semiconductor film (functional region) is obtained. More specifically, on a seed substrate having crystallinity, such as a Ge substrate, a semiconductor layer having a lattice constant different from the substrate, for example, an interface separating layer composed of InGaAs, is heteroepitaxially grown. Subsequently, a semiconductor layer composed of GaAs or the like is formed on the interface separating layer. Next, in the step of joining, the seed substrate is joined to a second substrate, e.g., a Si substrate, having a separation layer thereon, such that the semiconductor layer is disposed inside to form a composite member. Subsequently, in the step of separation, cracks extending in the in-plane direction are formed inside the interface separating layer of the composite member and/or the interface between the interface separating layer and the semiconductor layer, and/or the interface between the interface separating layer and the seed substrate. Thus, the semiconductor layer and the second substrate are separated from the composite member. Through the above steps, the semiconductor layer (functional region) is transferred from the seed substrate to the second substrate, thus preparing the second substrate having the separation layer and the semiconductor layer thereon.

In this case, the seed substrate may be composed of a material having a single-crystal structure. Besides a Ge substrate, for example, substrates composed of $Al_2O_3$, SiC, GaAs, InP, or Si may be used. The interface separating layer should be composed of a material having a lattice constant and/or a thermal expansion coefficient different from the substrate. As for the interface separating layer, besides InGaAs, for example, compound semiconductor materials such as GaN, InGaN, AlGaN, AlN, AlAs, AlGaAs, InAlAs, InGaAlP, InGaAsP, and InGaP may be used. As for the semiconductor layer, besides GaAs, for example, compound semiconductor materials containing any of GaN, AlGaAs, InP, InGaN, AlGaN, AlN, AlAs, InGaAs, InAlAs, InGaAlP, InGaAsP, and InGaP may be used. As for the second substrate, besides semiconductor substrates composed of Si or the like, for example, metal substrates composed of Al, Cu, Cu—W, or the like, insulating substrates composed of glass or the like, and flexible substrates composed of a plastic or the like may be used. In the step of separating the semiconductor layer and the second substrate from the composite member, a fluid (liquid or gas) may be sprayed on the interface separating layer or in the vicinity thereof. By injecting a fluid inside the interface separating layer and/or into the interface between the interface separating layer and the semiconductor layer, and/or into the interface between the interface separating layer and the substrate, cracks are formed in the injected portions of the composite member, and thus the separation can be suitably performed.

An LED array can be manufactured by employing the above method for transferring functional regions. For example, an LED array in which a circuit for driving an LED and a functional region serving as a light-emitting layer are electrically connected to each other can be produced. An LED printer head can also be produced by mounting a rod lens array on LED arrays. Furthermore, an LED printer including an LED printer head having LED arrays, a photosensitive member (photosensitive drum), a charger, and an imaging unit configured to write an electrostatic latent image on the photo-sensitive drum using the LED printer head as a light source can also be produced. A color LED printer provided with a plurality of imaging units each configured to write an electrostatic latent image on a photosensitive drum using an LED printer head as a light source can also be produced.

Specific embodiments of a method for transferring functional regions, an LED array, an LED printer head, an LED printer, or the like of the present invention will now be described.

First Embodiment

Figure 1B:
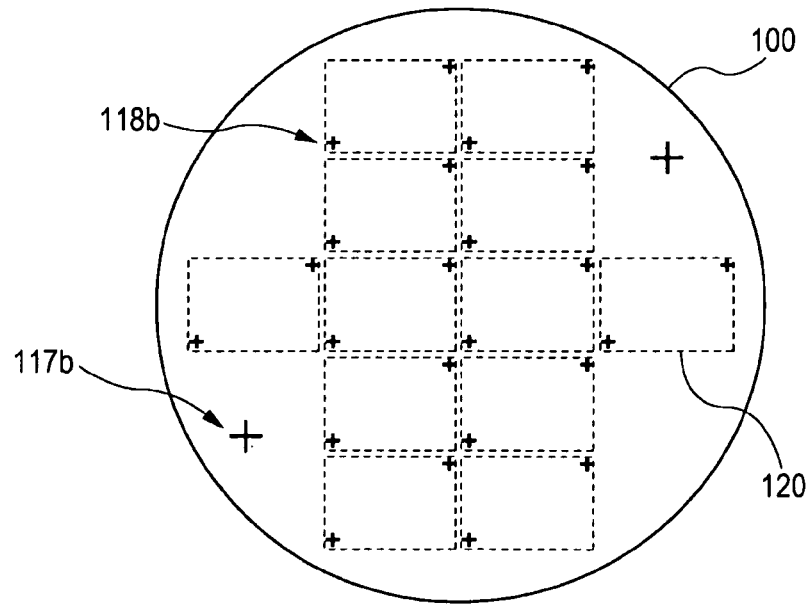
FIG. 1B is a plan view of a second substrate (e.g., glass substrate) used in the method according to the embodiment of the present invention.

A first embodiment according to a method for transferring functional regions will be described. FIG. 1A shows a compound semiconductor substrate (GaAs substrate in this embodiment shown in the figure) 103 used as a first substrate serving as a seed substrate. FIG. 1B shows a transparent glass substrate 100 used as a second substrate serving as a transfer destination substrate. The sizes (diameters) of the two substrates are substantially the same. A functional region is epitaxially grown on the compound semiconductor substrate 103 and is then separated into a plurality of island-like regions by etching or the like. Furthermore, the plurality of separated island-like regions form groups (a first group 101 and a second group 102 are shown in FIG. 1A). The plurality of groups are arranged with regions 110 therebetween, the regions being disposed at predetermined intervals. Furthermore, alignment regions (alignment marks) 117a and 118a are formed on the GaAs substrate 103. The alignment regions 117a are formed in regions outside the groups each including a plurality of island-like regions. The alignment regions 118a are formed in the region of each of the groups. As for the shape and the arrangement of the island-like functional regions, in the embodiment shown in the figure, stripe-shaped functional regions are arranged in parallel in each group. However, functional regions having various shapes (e.g., a circular shape) can be disposed in various types of arrangement. The shape and the arrangement may be determined according to the intended use.

The glass substrate 100 shown in FIG. 1B includes segments 120, which are regions corresponding to the groups each including a plurality of island-like regions on the compound semiconductor substrate 103. One segment 120 may be determined so as to correspond to one group. Alternatively, one segment 120 may be determined so as to correspond to a plurality of groups. In the embodiment shown in the figures, one segment 120 corresponds to one group. In the region of each segment 120, alignment regions (alignment marks) 118b are formed so as to correspond to the alignment regions 118a. In addition, alignment regions (alignment marks) 117b are formed in regions outside the segments 120 so as to correspond to the alignment regions 117a. In FIGS. 1A and 1B, broken lines showing the regions of the segments 120 and the groups each including a plurality of island-like regions are drawn. In actual substrates, such indication marks may be provided or may not be provided.

Figure 2A:
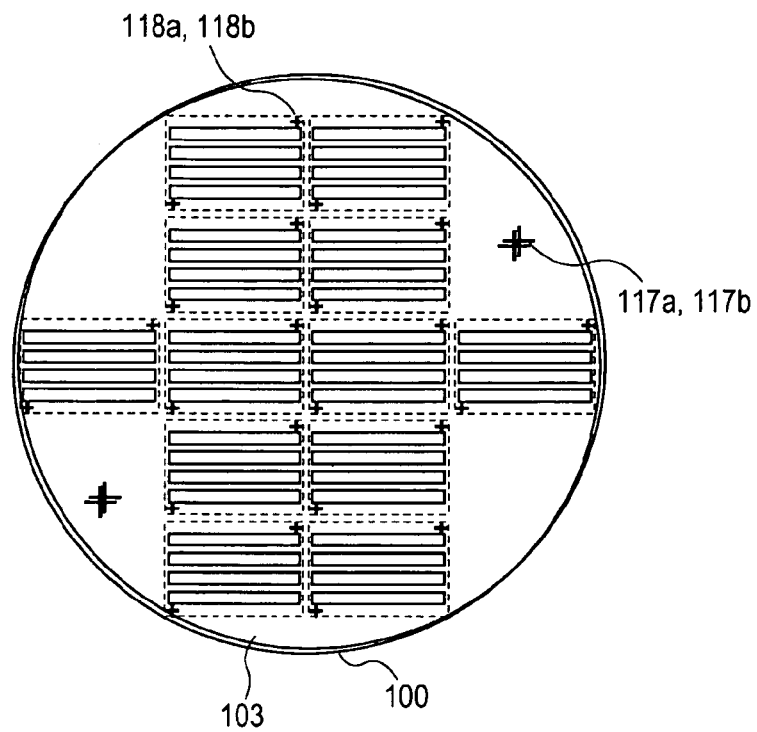
FIG. 2A is a view illustrating a step of aligning the first substrate shown in FIG. 1A with the second substrate shown in FIG. 1B and joining the substrates to each other.
Figure 2B:
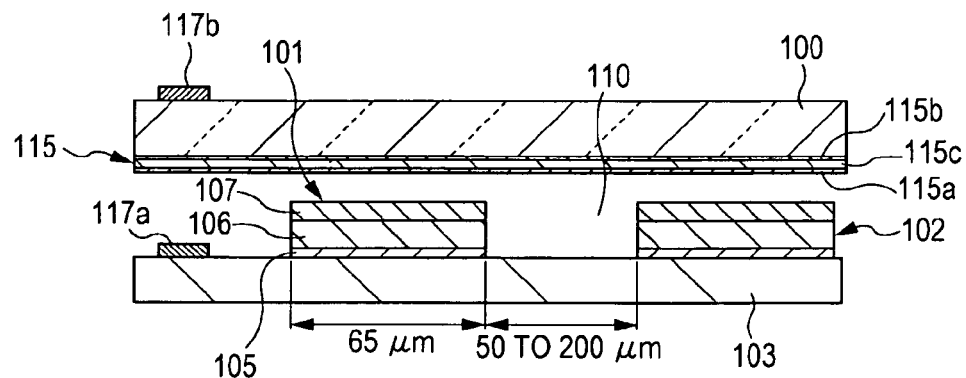
FIG. 2B is a view illustrating the step of aligning the first substrate shown in FIG. 1A with the second substrate shown in FIG. 1B and joining the substrates to each other.
Figure 2C:
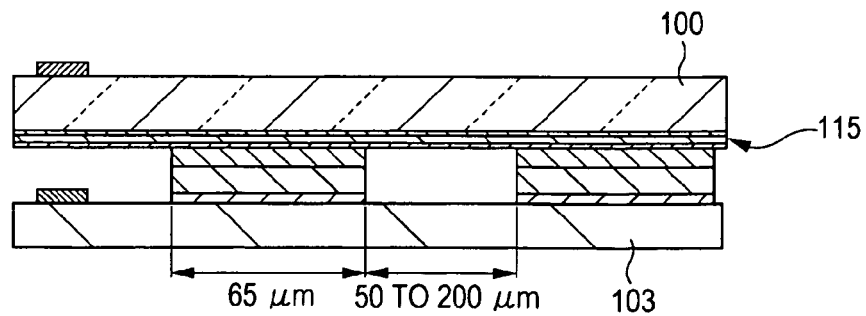
FIG. 2C is a view illustrating the step of aligning the first substrate shown in FIG. 1A with the second substrate shown in FIG. 1B and joining the substrates to each other.

FIGS. 2A to 2C show a step of joining the glass substrate 100 to the compound semiconductor substrate 103. FIG. 2A shows a state in which the glass substrate 100 and the compound semiconductor substrate 103 are overlapped with each other with the alignment of the alignment marks 117a and 117b and the alignment marks 118a and 118b, viewed through the transparent glass substrate 100. FIG. 2B is a side view showing a state immediately before the glass substrate 100 is joined to the compound semiconductor substrate 103. FIG. 2C is a side view showing a state in which the glass substrate 100 is overlapped with and joined to the compound semiconductor substrate 103.

In this embodiment, as shown in FIG. 2B, the first group 101 and the second group 102, which are to be transferred from the compound semiconductor substrate 103 serving as a seed substrate to the glass substrate 100, include a compound semiconductor film 106. As shown in FIGS. 2B and 2C, functional regions of the first group 101 and the second group 102 are formed by providing an etching sacrificial layer 105 serving as a first separation layer (also referred to as "release layer") and the compound semiconductor film 106 on the compound semiconductor substrate 103 from the compound semiconductor substrate 103 side in that order. In this case, a resist 107 is formed on the compound semiconductor film 106 provided on the compound semiconductor substrate 103 and is then patterned. Regions between the plurality of island-like regions and regions between the groups 101 and 102, thereby forming grooves between the plurality of island-like regions and interval regions 110. Thus, regions between the plurality of the island-like regions are also separated by etching in each of the groups.

As for the seed substrate 103, a GaAs substrate, a p-type GaAs substrate, an n-type GaAs substrate, an InP substrate, a SiC substrate, a GaN substrate, or the like can be used. Alternatively, instead of such a compound semiconductor substrate, a sapphire substrate, a Ge substrate, or the like can also be used. The etching sacrificial layer refers to a layer that is etched at an etching rate higher than that of the compound semiconductor multilayer film. In this embodiment, the etching sacrificial layer is an AlAs layer or an AlGaAs layer (e.g., $Al_{0.7}Ga_{0.3}As$). When the AlGaAs layer is composed of $Al_{x}Ga_{x-1}As$ (where x is 0.7 or more and 1 or less, i.e., between 0.7 and 1, inclusive), at an x of 0.7 or more, the etching selectivity is high. When an AlAs layer is used as the etching sacrificial layer, an HF solution diluted to 2% to 10% can be used as an etchant. As for the second substrate serving as a transfer destination substrate, instead of a glass substrate, a silicon substrate or the like may also be used.

When a sapphire substrate is used as the seed substrate 103, a metal nitride film such as a chromium nitride (CrN) film may be formed as the etching sacrificial layer on the substrate. In such a case, a functional multilayer film for realizing a device (such as an LED or laser) for blue or ultraviolet light can be epitaxially grown on the chromium nitride film. For this multilayer film, GaInN may be used as an active layer, and AlGaN or GaN may be used as a spacer layer. A commonly used Cr etchant (such as a chromium etching solution) can be used as an etchant of the metal nitride film such as a chromium nitride (CrN) film serving as the sacrificial layer.

In the joining shown in FIG. 2C, the glass substrate 100 is joined to the first group 101 and second group 102 on the compound semiconductor substrate 103 with a separation layer 115, such as a sheet having an adhesive layer, serving as a second separation layer therebetween. Here, the separation layer 115 is a double-sided release tape including a separation layer 115a and a separation layer 115b that contain materials which are decomposed or the bonding strengths of which are decreased under different conditions. In this embodiment, the separation layer 115a is a UV-releasable adhesive layer formed on a surface of a sheet base material 115c. The separation layer 115b is a heat-releasable (also referred to as "thermal releasable") or pressure-sensitive adhesive layer formed on another surface of the sheet base material 115c.

Figure 3A:
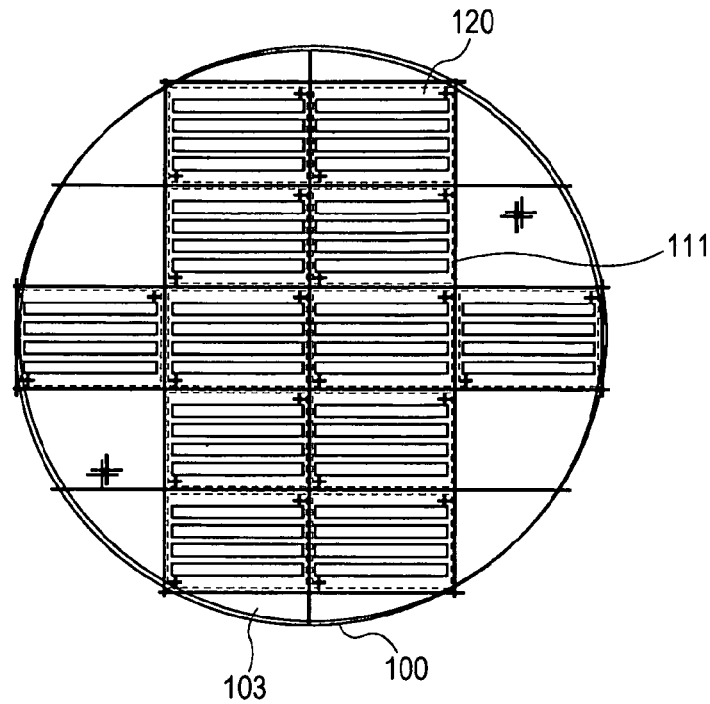
FIG. 3A is a view illustrating a step of providing separation grooves through the second substrate shown in FIG. 1B and transferring functional regions from the first substrate to segments of the second substrate.
Figure 3B:
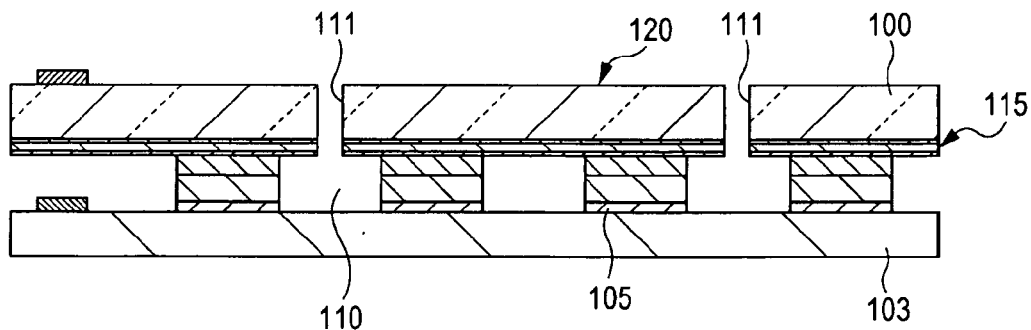
FIG. 3B is a view illustrating the step of providing the separation grooves through the second substrate shown in FIG. 1B and transferring functional regions from the first substrate to segments of the second substrate.
Figure 3C:
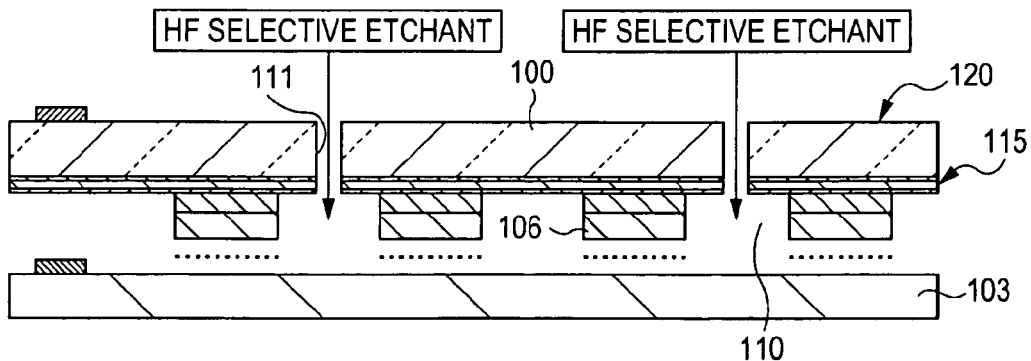
FIG. 3C is a view illustrating the step of providing the separation grooves through the second substrate shown in FIG. 1B and transferring functional regions from the first substrate to segments of the second substrate.

FIGS. 3A to 3C show a step of transferring the groups of the functional regions on the compound semiconductor substrate 103 to the segments 120 of the glass substrate 100. FIG. 3A shows an example of a pattern of scribe lines 111 which are separation grooves formed through the glass substrate 100 overlapped with the compound semiconductor substrate 103. FIG. 3B is a side view of the scribe lines 111 formed through the glass substrate 100. FIG. 3C is a side view showing a state in which the functional regions are separated from the compound semiconductor substrate 103. In FIG. 3A, the scribe lines 111 are drawn so that one group corresponds to one segment 120. However, in FIGS. 3B and 3C, the scribe lines 111 are not drawn in such a manner. Either pattern may be adopted.

Thus, the scribe lines 111 provided through the glass substrate 100 are formed using, for example, a dicing machine at positions corresponding to at least a part of the interval regions 110 disposed between a plurality of groups. The scribe lines 111 are formed through the glass substrate 100 and the separation layer 115 from a surface of the glass substrate 100, the surface being opposite to the surface having the separation layer 115 thereon. Thus, a segment substrate not having through-grooves is bonded to island-like regions with a double-sided release tape therebetween, and a cut is then made with a dicing machine or the like from a surface of the segment substrate to the separation layer on the first substrate to form through-grooves for introducing an etchant. This method is effective to reduce the cost because the through-grooves are formed through the substrate 100 and the separation layer 115 at the same time in the cutting step.

Alternatively, separation grooves may be formed through the transfer destination substrate 100 as follows. For example, when the substrate 100 is a silicon substrate, through-grooves serving as separation grooves can be formed by reactive ion etching (RIE) using fluorine under the atmosphere of $SF_6$ or the like. The radical species is not limited to fluorine. When the through-grooves are formed by a wet process, NaOH, KOH, tetramethylammonium hydroxide (TMAH), or the like may be used. More specifically, a mask layer for forming grooves is formed using a resist on a surface of a silicon substrate, the surface opposite to a surface on which the separation layer 115 is formed, and the grooves are then formed on the silicon substrate using the resulting mask. Dry etching such as RIE or wet etching may be employed. Alternatively, for example, a sandblaster may also be used with which grooves are formed while physically breaking a silicon substrate by blasting quartz fine particles or the like onto exposed portions of the substrate. Such through-grooves can be formed, for example, through a silicon wafer having a large thickness of several hundreds of micrometers while protecting sidewalls without decreasing the aspect ratio. Furthermore, such through-grooves can also be easily formed through a member such as a glass substrate. Thus, through-grooves can be formed using fluid energy or by blasting solid particles as in a sandblasting method instead of forming grooves by chemical etching. A laser drill or a micro drill may also be used.

As described above, as shown in FIG. 3B, a composite member having the interval regions 110 provided between the compound semiconductor films 106, and separation grooves 111 provided through the glass substrate 100 and the separation layer 115 so as to be connected to the interval regions 110 is prepared.

Next, as shown in FIG. 3C, an etchant is brought into contact with the etching sacrificial layer 105 through the separation grooves 111 and the interval regions 110 to etch the etching sacrificial layer 105, thereby separating the compound semiconductor substrate 103 from the composite member. Thus, a plurality of segments 120 of the glass substrate 100, the segments 120 being provided with the groups 101 and 102 of the functional regions, are prepared. The separated compound semiconductor substrate 103 can be reused in order to form functional regions including a new compound semiconductor film. When the separation grooves 111 have a large depth, bubbles of a gas (hydrogen) generated by the etching of the etching sacrificial layer composed of AlAs or the like may clog the outlet of the separation grooves 111. In such a case, ultrasonic waves may be continuously or intermittently applied to a solution for etching and a wafer such as a compound semiconductor substrate. Alternatively, an alcohol or a lubricant that decreases the wetting angle may be added to an etchant (e.g., hydrofluoric acid) so as to suppress the generation of bubbles or to remove the bubbles.

As described above, a method for preparing a plurality of segments 120 of the second substrate 100 is not limited to the above method. For example, a method may be employed in which the second substrate 100 is prepared by separating the seed substrate 103 from the composite member by spraying a fluid onto the side faces of the interface separating layer of the composite member or in the vicinity thereof. However, in this case, after the step of separating the seed substrate 103, the separation grooves 111 may be formed through the second substrate 100 while fixing the second substrate 100 with a fixing device, thus separating the second substrate 100 into a plurality of segments 120.

Next, a description will be made of a step of further transferring functional regions from the segments 120 bearing the groups each including a plurality of functional regions obtained through the above-described steps to another substrate. In this step, when the segments 120 are completely divided by the separation grooves (scribe lines) 111, a plurality of segments 120 may be tentatively arranged on an adhesive tape or a plurality of segments 120 may be tentatively fixed with a fixing device or the like. Desired segments 120 are selected and taken from this state, and the next transfer step is performed. Alternatively, the separation grooves (scribe lines) 111 may be formed so that the segments 120 are not completely separated from each other. For example, the following method may also be employed. The separation grooves 111 may be formed so that a substrate material remains in some portions as in a rough perforation made by a sewing machine, and at the time of selecting and taking desired segments 120, the portions of the substrate material where the material remains may be broken to separate the segments 120 from each other.

Figure 4A:
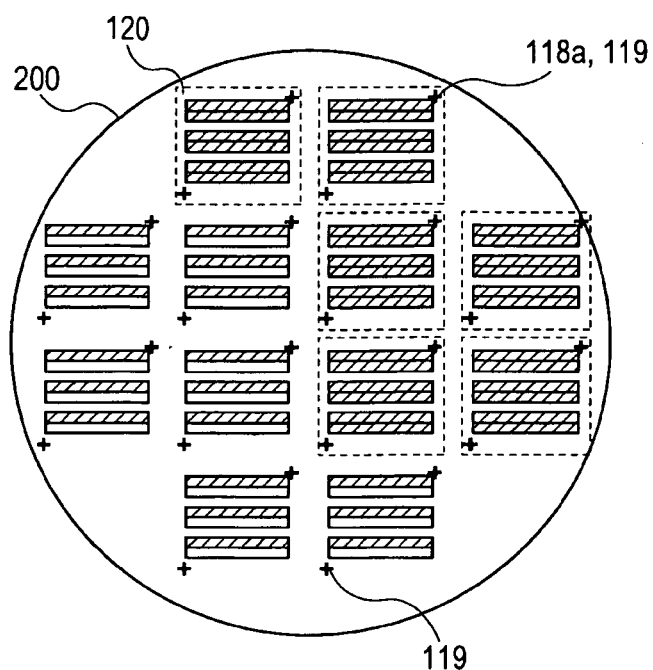
FIG. 4A is a view illustrating a step of transferring functional regions from segments of the second substrate shown in FIG. 1B to another substrate (e.g., silicon circuit substrate).
Figure 4B:
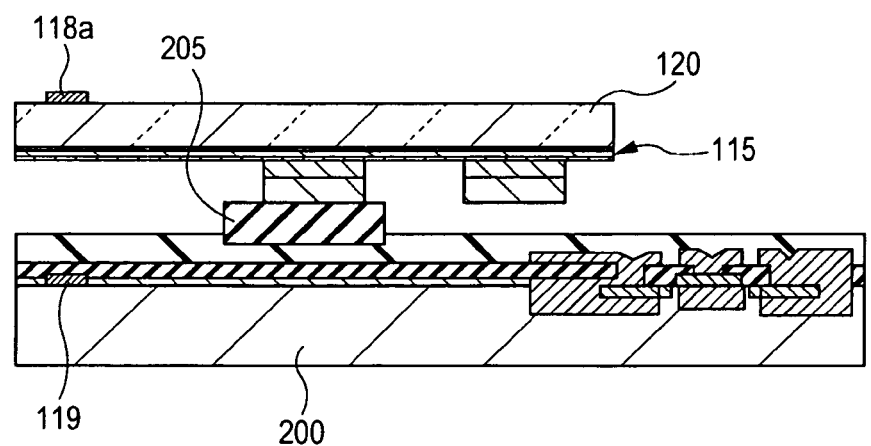
FIG. 4B is a view illustrating the step of transferring functional regions from segments of the second substrate shown in FIG. 1B to another substrate (e.g., silicon circuit substrate).

FIGS. 4A and 4B show a step of transferring the functional regions from the segments 120 to a silicon circuit substrate 200. Here, the size of the silicon circuit substrate 200 is significantly larger than the sizes of the glass substrate 100 and the segments 120. Furthermore, it is assumed that a plurality of island-like functional regions on a segment 120 are selectively transferred onto different substrates or different regions of the same substrate. Alternatively, a plurality of island-like functional regions on a segment 120 may be transferred onto predetermined regions of the same substrate at one time. FIG. 4A shows a step of transferring the functional regions from the segments 120 onto respective portions on the silicon circuit substrate 200. An alignment region 119 on the silicon circuit substrate 200 is aligned with a corresponding alignment region 118a on a segment 120 to perform the transfer. FIG. 4B is a cross-sectional view showing a step of selectively transferring a functional region from a segment 120 to a portion of the silicon circuit substrate 200.

In the transfer, first, a joining layer (also referred to as "bonding layer") having a predetermined thickness is formed on at least one of a first functional region included in a plurality of functional regions on a segment 120 and a region on the silicon circuit substrate 200 where the first functional region is to be transferred. As shown in FIG. 4B, in this example, a joining layer 205 is provided in a region on the silicon circuit substrate 200 where the first functional region is to be transferred. The joining layer 205 is formed as follows. A joining layer (organic insulating layer) 205 having a pre-determined thickness is formed on the substrate 200, and only the region on the joining layer 205 where the first functional region is to be transferred is masked with a resist. Etching is then performed by chemical etching or RIE to form the joining layer 205 only in the desired region. The resist is then removed with an asher or the like. In this example, the thickness of the joining layer 205 is controlled to be about 2.0 micrometers, and the surface thereof is made to be sufficiently smooth. This degree of thickness can prevent other functional regions from being strongly pressed onto the surface of the substrate 200 when the first functional region is joined to the joining layer 205. The thickness of the joining layer 205 is preferably in the range of about 1.0 to 10 micrometers. If the thickness is 1.0 micrometer or less, the above effect decreases. If the thickness is 10 micrometers or more, after the transfer of the functional region, a problem such as disconnection tends to occur when the functional region is electrically connected to a circuit and the like provided on the substrate with metal wiring.

In the present invention, in general, the area of each segment 120, and furthermore, the area of individual functional regions to be divided and transferred are smaller than the area of the silicon circuit substrate 200. Accordingly, the parallelism thereof can be relatively easily ensured on the basis of, for example, the accuracy of bump bonding of a flip-chip bonder or the like. Consequently, the possibility in which other functional regions are strongly pressed onto the surface of the substrate 200 during, for example, joining is low, and thus roughening the surface of a non-transfer region, which is a region other than the transfer region on the substrate 200, is not essential. However, in order to more reliably perform a selective transfer, the surface of a region that may contact other functional regions may be roughened. In such a case, the surface of the non-transfer region may be roughened as follows.

For example, irregularities forming a roughened surface can be formed by performing over-etching or the like when the joining layer (organic insulating layer) 205 is formed. The surface of the irregularities is sufficiently rougher than the surface of the joining layer 205. For example, regarding the smoothness of the surface of the joining layer 205, $R_{pv}$ (the maximum of the difference between the peak and the valley of irregularities) is about 2 nm or less and $R_a$ (the average of the difference between the peak and the valley of irregularities) is about 0.2 nm or less. In contrast, regarding the roughness of the surface of the irregularities, $R_{pv}$ (the maximum of the difference between the peak and the valley of irregularities) is about 2 nm or more and $R_a$ (the average of the difference between the peak and the valley of irregularities) is about 0.2 nm or more. As described above, a plurality of functional regions are disposed in the form of islands on a separation layer 115 of a segment 120 of the substrate 100, the separation layer 115 being provided on the substrate 100, and besides the first functional region, a second functional region and the like are provided on the separation layer 115. Predetermined irregularities may be formed at least on the surface of a region on the substrate 200, the region corresponding to the second functional region that is other than the first functional region and that remains on the segment 120.

In this embodiment, the joining layer 205 is a film composed of an organic material for example. An example of such a film composed of an organic material is an organic insulating film composed of polyimide or the like. Besides polyimide, an epoxy adhesive layer or the like may also be used. Alternatively, instead of the above-mentioned organic material films, spin-on polymers in which a methyl group, an ethyl group, a phenyl group, or the like is added to an inorganic insulating oxide film, such as a silicon oxide film, to increase plasticity or organic spin-on glass (organic SOG) may also be used as the insulating film. For example, in the case where the substrate 200 includes circuit regions formed on and/or inside a silicon substrate serving as the substrate 200, the following method may be employed. Specifically, a silicon oxide insulating film (which has a certain degree of adhesive property at a pre-baking temperature of about 100 degrees Celsius) for increasing the flatness on the circuit regions is formed on the substrate 200 so as to have a predetermined thickness using organic SOG, and the silicon oxide insulating film may then be patterned. In this example, as described above, the surface of the joining layer 205 may have a certain degree of adhesive property after a pre-baking treatment from the standpoint that joining is efficiently performed in the subsequent step of joining. In general, tackiness (adhesive property) is exhibited by a silanol group, which is a hydrolyzable group, or an alkoxy group, which is an organic component contained in an organic insulating material (spin-on polymer). A dehydration condensation reaction of these components proceeds at a processing temperature, thus increasing joining (bonding) strength between wafers or between devices. As for plasticity, among organic components, non-hydrolyzable groups contribute to the stability of plasticity of a substance at a high temperature (>400 degrees Celsius). It is known that the most important factors that determine success or failure of a bonding technique are the surface flatness and particles. In this regard, by interposing an organic insulating layer having plasticity and tackiness, the flatness required for a joining surface or a base on which device structures and the like are provided can be increased. In addition, particles having a size of a certain order can be embedded in the interposed organic insulating layer owing to the plasticity thereof. Accordingly, the influence of particles can also be substantially eliminated. Plasticity also plays an important role in the reduction of distortion accumulated in the case where the thickness of a layer is increased. When a layer contains a small amount of an organic component that improves plasticity and has a relatively large thickness of 1 micrometer or more, defects such as cracks or fractures may be generated. For these reasons, when the amount of organic component contained in a hydrolyzable or a non-hydrolyzable group contained in organic SOG is controlled to be about 1 percent by weight or more, a satisfactory adhesive property and plasticity can be achieved, and a stable film can be formed even in the case where the film has a thickness on the order of microns.

As described above, the substrate 200 is, for example, a semiconductor substrate, a silicon substrate, a silicon wafer having an oxide layer on a surface thereof, or a silicon wafer on which a desired electric circuit (e.g., driver circuit) is provided. Herein, the driver circuit refers to, for example, a circuit configured to drive and control a light-emitting diode (LED) in the case where the LED includes a compound semiconductor multilayer film. In addition to a Czochralski (CZ) wafer, a substrate having an epitaxial silicon layer on a surface thereof may also be used as a silicon substrate. Alternatively, a silicon-on-insulator (SOI) substrate may be used instead of a silicon substrate.

Figure 5A:
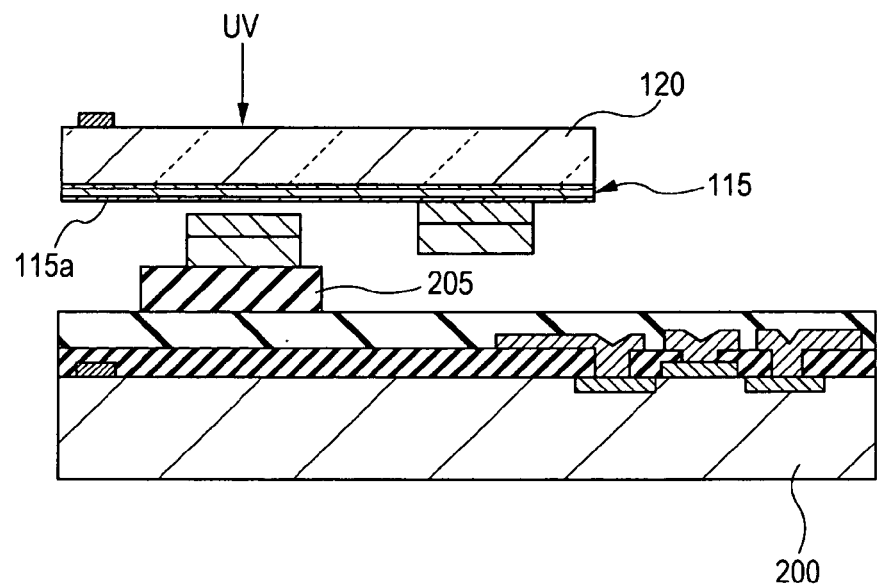
FIG. 5A is a view illustrating the step of transferring functional regions from segments of the second substrate shown in FIG. 1B to another substrate (e.g., silicon circuit substrate).

Next, a description will be made of a step of joining the first functional region to the substrate 200 with the joining layer 205 therebetween, and a step of separating the segment 120 of the substrate 100 from the first functional region by treating the UV-releasable adhesive layer 115a of the separation layer 115 under a predetermined condition. As shown in FIG. 4B, the first functional region on the separation layer 115 of the segment 120 is aligned with and joined to the joining layer 205. Subsequently, as shown in FIG. 5A, the segment 120 is separated from the first functional region at the UV-releasable adhesive layer 115a of the separation layer 115. In this example, the UV-releasable adhesive layer 115a is composed of a material that becomes separable by performing a certain treatment. This treatment means a treatment that causes decomposition of the separation layer or a decrease in the bonding strength thereof. Here, UV light is applied from the transparent segment 120 side to cause decomposition of the UV-releasable adhesive layer 115a or a decrease in the bonding strength thereof, thus separating the first functional region from the segment 120. In this step, for example, a UV laser beam (having a UV wavelength in the range of 300 to 400 nm, for example) may be focused on a very small spot and scanned.

Alternatively, in this embodiment, the first functional region can be separated from the segment 120 at the UV-releasable adhesive layer 115a by irradiating the entire surface of the separation layer 115 with light. When the entire surface of the separation layer 115 is irradiated with light, the whole UV-releasable adhesive layer 115a of the separation layer 115 is decomposed or the bonding strength of the whole UV-releasable adhesive layer 115a is decreased. Consequently, the first functional region joined to the joining layer 205 is separated from the UV-releasable adhesive layer 115a owing to the joining force between the first functional region and the joining layer 205. In this case, the adhesive force of the UV-releasable adhesive layer 115a of the separation layer 115 is decreased also in other portions corresponding to functional regions that are not joined to the substrate 200. However, since a peeling force does not act on the portions of the other functional regions from the substrate 200 side, the other functional regions remain on the segment 120 side. This method can be easily performed at a low cost as long as conditions (for example, the material of the separation layer, the wavelength of light, the light intensity, the irradiation time, and the like) are selected in detail because the irradiation of light can be simply performed without using a light-shielding layer while ensuring reliability. When the UV irradiation is performed over the entire surface of the separation layer 115, an i-line UV lamp or an LED that emits UV light may be used. Also in this case, other functional regions remaining on the segment 120 side with the UV-releasable adhesive layer 115a of the separation layer 115, the UV-releasable adhesive layer 115a having a decreased adhesive force, can also be further transferred another substrate as described below.

The structure of the separation layer 115 is not limited to the above structure. The separation layer 115 may be a sheet in which the UV-releasable adhesive layer 115a and the heat-releasable or pressure-sensitive adhesive layer 115b may be reversely arranged as compared with the example shown in the figures. Alternatively, a UV-releasable layer and a pressure-sensitive releasable layer may be combined. Separation layers having different properties may be provided on the segments 120 as to correspond to the first functional region and other functional regions. For example, one may be a UV-releasable adhesive layer, and the other may be a heat-releasable adhesive layer (also referred to as "thermal releasable adhesive layer"). Alternatively, one may be a first light-releasable adhesive layer (also referred to as "radiation releasable adhesive layer"), and the other may be a second light-releasable adhesive layer (i.e., an adhesive layer which is decomposed or the bonding strength of which is decreased with light having a wavelength different from the wavelength used for the first light-releasable adhesive layer). Alternatively, one may be a first heat-releasable adhesive layer, and the other may be a second heat-releasable adhesive layer (i.e., an adhesive layer which is decomposed or the bonding strength of which is decreased at a temperature different from the temperature for the first heat-releasable adhesive layer). The separation layer 115 may not be composed of a sheet. Alternatively, the separation layer 115 may be formed on the substrate 100 by application, vapor deposition, or the like. A specific example of the material for the separation layer 115 is a material containing heat-foamable capsules. Examples of a UV-releasable adhesive material include a material in which cross-linking is cleaved by irradiation of UV energy, and a material containing capsules that form foams by absorbing UV light. An example of a heat-releasable adhesive material is REVALPHA (trade name, manufactured by Nitto Denko Corporation).

Figure 5B:
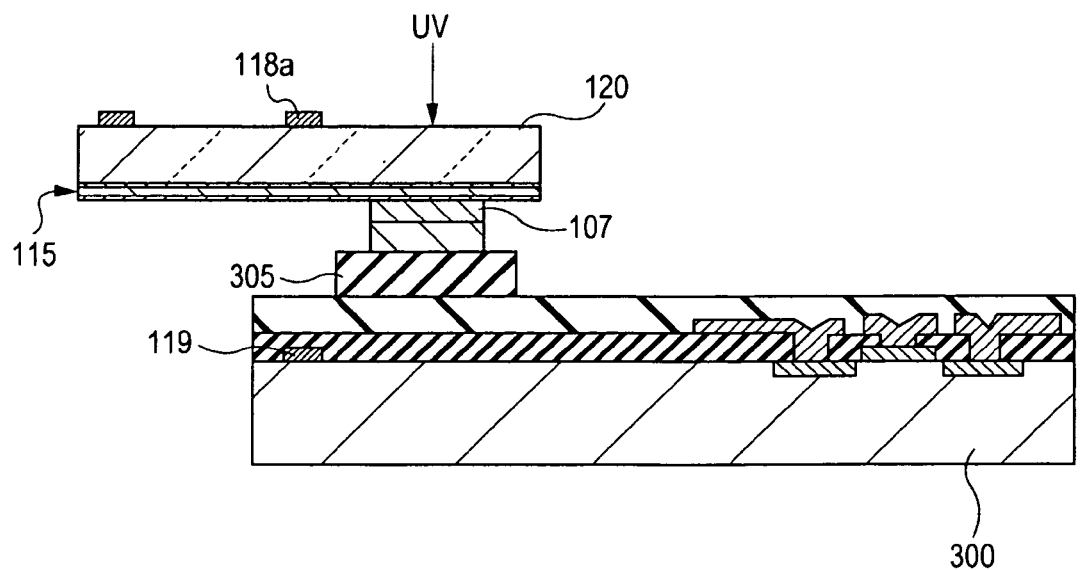
FIG. 5B is a view illustrating the step of transferring functional regions from segments of the second substrate shown in FIG. 1B to another substrate (e.g., silicon circuit substrate).

Next, a description will be made of a step of forming a second joining layer 305 with a predetermined thickness on at least one of a second functional region remaining on the segment 120 and a region on a substrate 300 where the second functional region is to be transferred, as shown in FIG. 5B. Here, the substrate 300 may be another region of the substrate 200. In addition, a description will be made of a step of joining the second functional region to the substrate 300 with the second joining layer 305 therebetween, and a step of separating the second functional region from the segment 120 by treating the separation layer 115 under a predetermined condition.

In the case where the second functional region is transferred onto the substrate 300, a process substantially the same as the transfer of the first functional region can also be performed. Specifically, as shown in FIG. 5B, the second joining layer (organic insulating layer) 305 is formed on the substrate 300, and only the region where the second functional region is to be transferred is masked with a resist 107. Etching is then performed by chemical etching or RIE to form the second joining layer 305 only in the desired region. Next, the second functional region is aligned with and joined to the second joining layer 305, and the second functional region is separated from the segment 120 at the separation layer 115. Also in this step, as shown in FIG. 5B, UV light is applied from the transparent segment 120 side to cause decomposition of the UV-releasable adhesive layer 115a or a decrease in the bonding strength thereof, thus separating the second functional region from the segment 120.

Alternatively, instead of the irradiation of UV light, the second functional region may be separated from the segment 120 by heating to about 170 degrees Celsius to cause decomposition of a heat-releasable adhesive layer (also referred to as "thermal releasable adhesive layer") 115b of the separation layer 115 or a decrease in the bonding strength thereof. Subsequently, the resist 107 is removed by lift-off.

As described above, in the case where a second functional region is further transferred onto a substrate 300, a second joining layer 305 with a predetermined thickness is formed on at least one of the second functional region remaining on the segment 120 and a region on the substrate 300 where the second functional region is to be transferred. Subsequently, a step of joining the second functional region to the substrate 300 with the second joining layer 305 therebetween and a step of separating the second functional region from the segment 120 of the substrate 100 at a separation layer are further performed. Also in this case, predetermined irregularities may be formed on the surface of a portion of the substrate 300, the portion corresponding to a region other than the second functional region on the segment 120.

As described above, after the transfer destination substrate 100 is divided into a plurality of segments 120, for example, transfer and joining can be sequentially performed on a silicon substrate wafer, on which device circuits are provided, for each segment including a plurality of active layer regions. In this embodiment, functional regions can be efficiently transferred without loss even between substrates having different sizes by repeating a transfer a plurality of times. For example, functional regions are transferred from a 4-inch substrate serving as a seed substrate onto a transfer destination substrate, and the transfer destination substrate is divided into a plurality of segments. In this case, the functional regions on the seed substrate are densely arranged at small intervals so as to correspond to the size of a final transfer destination substrate (for example, a silicon 5-, 6-, 8-, or 12-inch wafer). Subsequently, among the functional regions arranged on a segment, only functional regions corresponding to transfer regions are transferred either selectively or at one time onto the transfer regions of the 5-, 6-, 8-, or 12-inch substrate serving as the final transfer destination substrate. Subsequently, among the functional regions arranged on the same segment or a different segment, only functional regions corresponding to other transfer regions are transferred either selectively or at one time onto the other remaining transfer regions of the 5-, 6-, 8-, or 12-inch substrate.

As described above, a transfer step is separately performed a plurality of times and functional regions are selectively transferred for each transfer region of a substrate via divided segments having a predetermined size. Accordingly, the functional regions can be transferred without loss even in the case where the sizes of the substrates are different. This technique is advantageous in a transfer between different types of substrates, different types of materials, or different types of devices, specifically, between a substrate material which is expensive and which has a relatively small diameter and a substrate material, such as silicon, which can be formed into a substrate having a large diameter and which is available at a relatively low cost, or between device groups formed on such substrate materials. In addition, significant economic advantages can be expected in transfer and junction between different types of substrates when the substrates are composed of inherently different materials and the diameter or the cost of the substrates are significantly different from each other. Furthermore, a plurality of active layer regions are arranged on each of the divided segments and a transfer of a device active layer is separately performed a plurality of times, thereby producing a plurality of host wafers with a large diameter on which different types of active layers have been transferred. Significant economic advantages can be expected as compared with a wafer produced by performing a transfer once.

Figure 15:
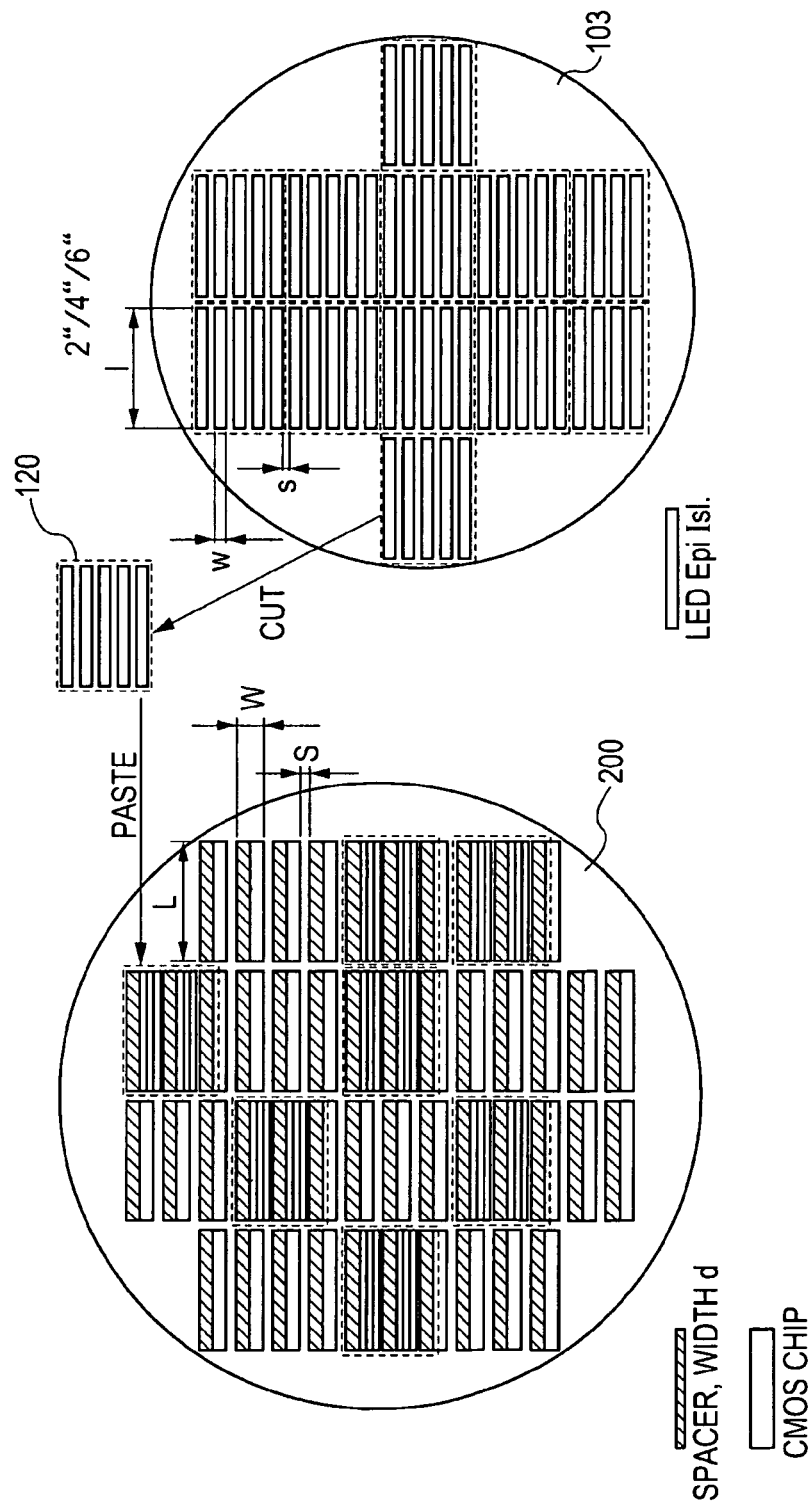
FIG. 15 includes plan views illustrating a step of transferring functional regions from a segment of a second substrate to a silicon wafer having a large diameter.

The first and second functional regions may be arranged on a segment 120 in any island formation. However, the first and second functional regions are typically arranged on a segment 120 at predetermined intervals. In this case, as shown in FIG. 4A for example, regions of the substrate 200 joined to the first functional regions (i.e., regions each including a region where the joining layer 205 is arranged and provided with a CMOS chip) are arranged at predetermined intervals. In such a structure, in the case where only the first functional region on a segment 120 is transferred onto an arrangement region of the joining layer 205 of the substrate 200, the transfer can be efficiently and effectively carried out when the following conditions are satisfied. As shown in FIG. 15, the width per unit region of the first functional region and the second functional region on a segment 120 is represented by w, the length thereof is represented by l, and the distance between the regions is represented by s; and the width per unit region of the substrate 200 to be joined to the first functional region is represented by W, the length thereof is represented by L, and the distance between the regions is represented by S. In this case, the following conditions may be satisfied. That is, w, l, s, W, L, and S may satisfy formulae 1 to 3 below.

$$l < L, \text{ or } l = L \quad \text{(Formula 1)}$$

$$W > w \quad \text{(Formula 2)}$$

$$W + S > w + s \quad \text{(Formula 3)}$$

Furthermore, formulae 4 to 6 below may also be satisfied.

$$l = L \quad \text{(Formula 4)}$$

$$W = n \times w \quad \text{(Formula 5)}$$

$$W + S = n(w + s) \quad \text{(Formula 6)}$$

In the above formulae, n represents an integer of 2 or more. Here, a selective transfer of functional regions disposed on a segment 120 of a substrate 100, onto which the functional regions have been transferred from a seed substrate 103, at a high density onto a transfer region of a joining layer of a final substrate 200 is repeated, for example, n times. In this case, when functional regions constituting a light-emitting layer or the like are transferred onto circuit elements or the like, the arrangement of the functional regions and the number of functional regions to be arranged are not significantly limited by the arrangement of the circuit elements or the like. Accordingly, the ratio of the area that can be used as the light-emitting layer or the like per unit area of the seed substrate can be increased. As a result, for example, a compound semiconductor wafer, which is significantly more expensive than a silicon wafer by several tens of times, can be efficiently used, and more significant economic advantages can be achieved in a composite multifunctional device integrated circuit. Furthermore, the functional regions can be prepared and transferred via the segments without significantly considering the difference in size between the seed substrate and the transfer destination substrate.

Here, for example, the silicon substrate 200 shown in FIG. 4B has a third functional region having a CMOS chip, and the first functional region is joined to the third functional region with the joining layer 205 therebetween. Similarly, the silicon substrate 300 shown in FIG. 5B has a fourth functional region, and the second functional region is joined to the fourth functional region.

Alternatively, the substrate 200 or 300 may not be a final transfer destination substrate and may be used as a tentative substrate as in the segments 120 of the substrate 100. Functional regions transferred onto the substrate 200 or 300 may be wholly transferred onto a final substrate. In such an embodiment, the following steps are performed. The first functional regions are joined to the substrate 200 with a joining layer serving as a separation layer that becomes separable by a certain treatment. For example, the joining layer 205 which is an organic insulating layer shown in FIG. 4B is replaced with a layer such as the separation layer 115. Next, a joining layer having a predetermined thickness is formed on at least one of the first functional regions joined with the separation layer disposed on the substrate 200 and a next transfer destination substrate. This joining layer can be formed by substantially the same method as the method for forming the above-described joining layer, but patterning is not necessary. Next, all the functional regions on the substrate 200 are joined to the next transfer destination substrate with the joining layer therebetween. Subsequently, the first functional regions are separated from the substrate 200 at the joining layer serving as the separation layer. It is not necessary that this joining layer be selectively made to be separable, and thus the joining layer may have a structure simpler than the above-described separation layer. The substrate 200 used as a tentative substrate may also be composed of a material similar to the substrate 100 described above.

Similar steps are performed for the second functional regions. According to this method, a plurality of functional regions on a segment 120 which is a tentative substrate are all selectively and tentatively transferred onto a plurality of substrates which are next tentative substrates, and the functional regions on these substrates are then wholly transferred onto each final substrate. This method seems to take a detour because the number of transfers onto a tentative substrate is increased. However, in some cases, such a method allows the operation to be performed smoothly, and thus the transfer can be efficiently performed.

According to this embodiment, for example, each region among a plurality of functional regions provided on a segment 120 of a substrate 100 can be selectively and reliably transferred onto other substrates. In addition, each portion of functional regions formed on a seed substrate at a high density can be transferred onto another substrate via the segment 120 without decreasing the yield. In this case, an arrangement pattern of the functional regions can be designed without significantly considering the difference in size between the seed substrate and the transfer destination substrate.

Furthermore, since a semiconductor region of a seed substrate can be efficiently used, devices can be manufactured at a low cost. In addition, the possibility in which functional regions that are not to be transferred contact another substrate can be decreased at the time of joining, thus suppressing the damage on the functional regions that are not to be transferred during the transfer of other functional regions.

Second Embodiment

A second embodiment according to a method for transferring functional regions will be described. The second embodiment differs from the first embodiment in the following point. In the first embodiment, alignment regions (alignment marks) are separately formed on both a seed substrate and a transfer destination substrate, and these two substrates are then overlapped using the alignment regions. In contrast, in the second embodiment, alignment regions (alignment marks) are provided on a seed substrate, and these alignment regions are also transferred onto a transfer destination substrate. Each segment of the transfer destination substrate uses the alignment regions in a subsequent transfer step. Accordingly, when the seed substrate and the transfer destination substrate are overlapped with each other, these substrates are aligned using, for example, edges of the two substrates without using the alignment regions. Since a significantly accurate alignment is not required in this step, even such an alignment can sufficiently achieve the purpose. Other configurations are the same as the first embodiment. Accordingly, the present embodiment will be described with reference to FIGS. 6A to 9B in which components having the same functions as the first embodiment are assigned the same reference numerals as those in the drawings used in the description of the first embodiment. FIGS. 6A to 9B correspond to FIGS. 2A to 5B, respectively.

Figure 6A:
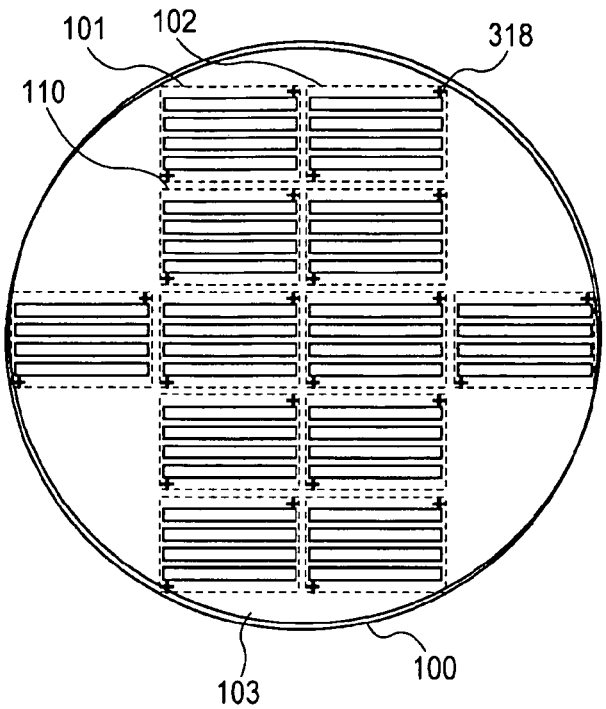
FIG. 6A is a view illustrating a step of aligning a first substrate and a second substrate which are used in a method for transferring functional regions according to another embodiment of the present invention and joining the substrates to each other.
Figure 6B:
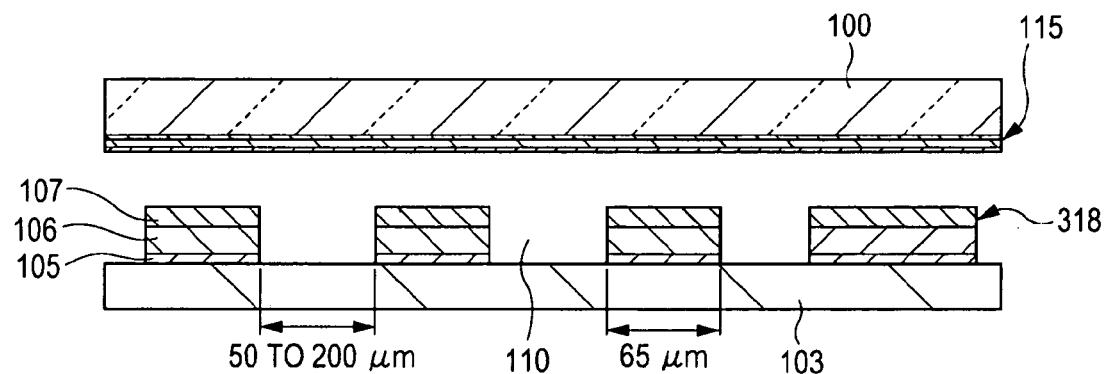
FIG. 6B is a view illustrating the step of aligning the first substrate and the second substrate which are used in the method according to the other embodiment of the present invention and joining the substrates to each other.
Figure 6C:
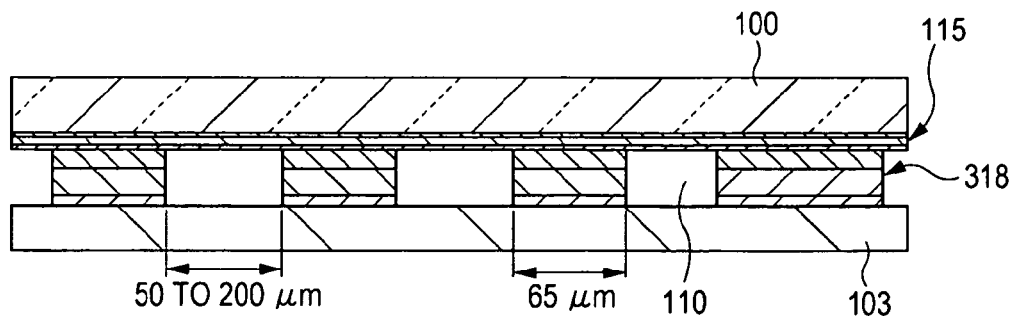
FIG. 6C is a view illustrating the step of aligning the first substrate and the second substrate which are used in the method according to the other embodiment of the present invention and joining the substrates to each other.

As shown in FIG. 6A to 6C, on a seed substrate 103 of this embodiment, alignment regions (alignment marks) 318 are provided in a region of groups 101 and 102 each including a plurality of island-like functional regions. Each of the alignment regions 318 also has the same layer structure as the island-like functional regions. That is, after a functional region is epitaxially grown on the entire surface of the seed substrate 103, the plurality of island-like functional regions and the alignment regions 318 are formed at the same time by patterning and etching.

Figure 7A:
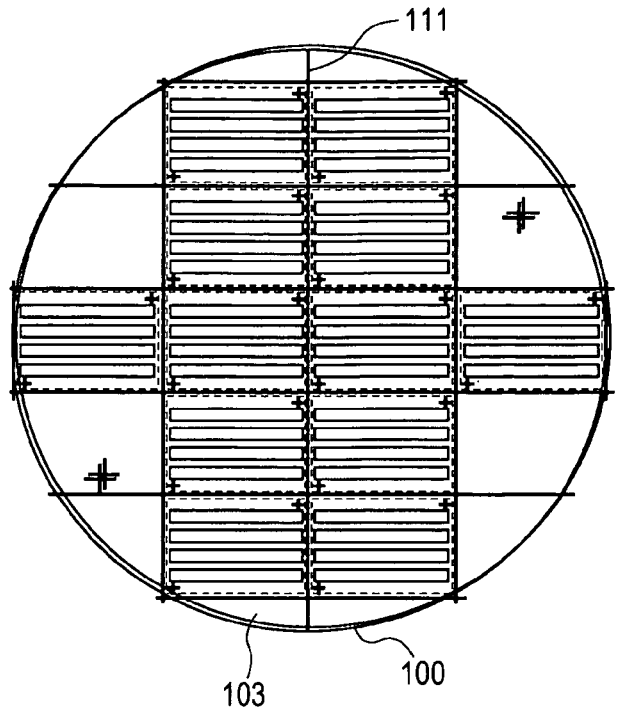
FIG. 7A is a view illustrating a step of providing separation grooves through the second substrate shown in each of FIGS. 6A to 6C and transferring functional regions and alignment regions from the first substrate to segments of the second substrate.
Figure 7B:
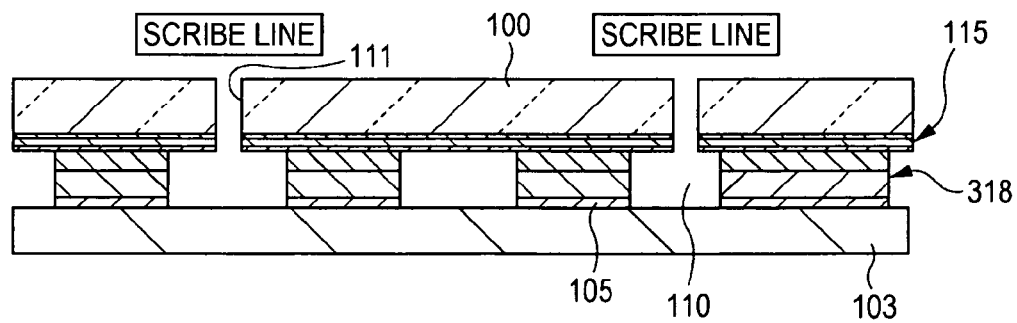
FIG. 7B is a view illustrating the step of providing separation grooves through the second substrate shown in each of FIGS. 6A to 6C and transferring functional regions and alignment regions from the first substrate to segments of the second substrate.
Figure 7C:
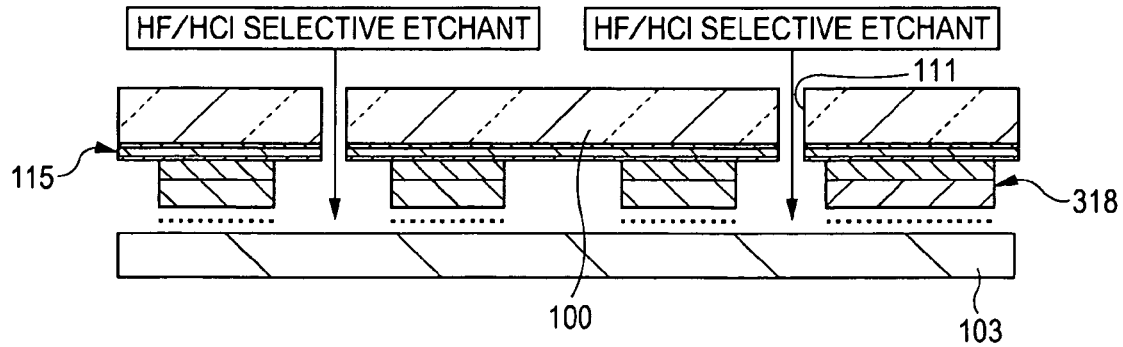
FIG. 7C is a view illustrating the step of providing separation grooves through the second substrate shown in each of FIGS. 6A to 6C and transferring functional regions and alignment regions from the first substrate to segments of the second substrate.

As shown in FIG. 6C, the alignment regions (alignment marks) 318 are also joined to a separation layer 115. Subsequently, as shown in FIG. 7C, an etchant is brought into contact with an etching sacrificial layer 105 through separation grooves 111 and interval regions 110 to etch the etching sacrificial layer 105, thus separating the substrate 103 from the composite member in which the seed substrate 103 and a glass substrate 100 are joined to each other. As a result, a plurality of segments 120 of the glass substrate 100, the segments 120 being provided with the groups 101 and 102 of the functional regions, are prepared. In this step, the alignment regions (alignment marks) 318 are also transferred onto each segment 120.

Figure 8A:
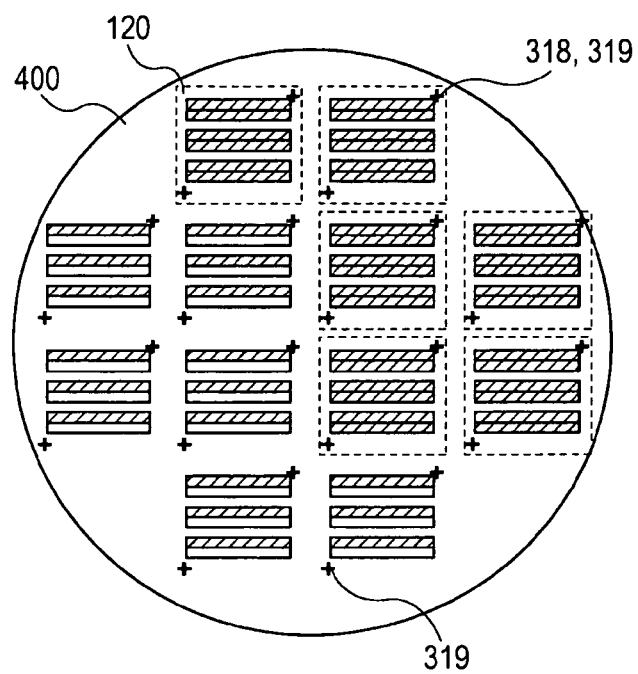
FIG. 8A is a view illustrating a step of transferring functional regions from segments of the second substrate shown in each of FIGS. 6A to 6C to another substrate.
Figure 8B:
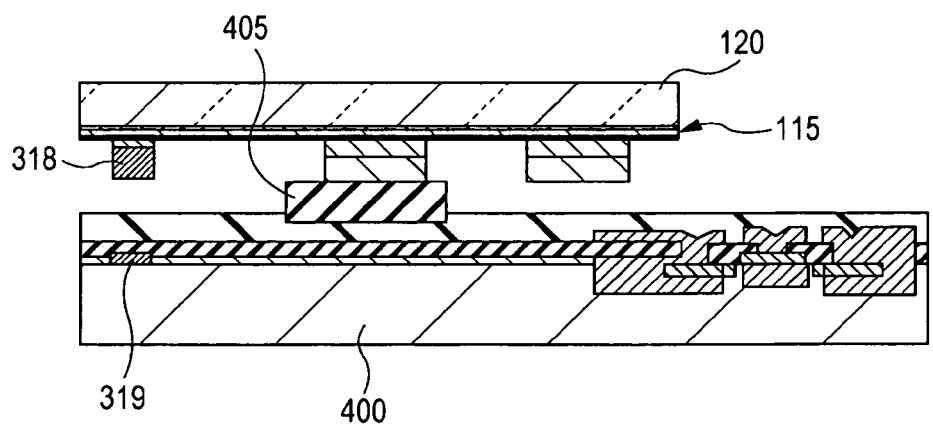
FIG. 8B is a view illustrating the step of transferring functional regions from segments of the second substrate shown in each of FIGS. 6A to 6C to another substrate.
Figure 9A:
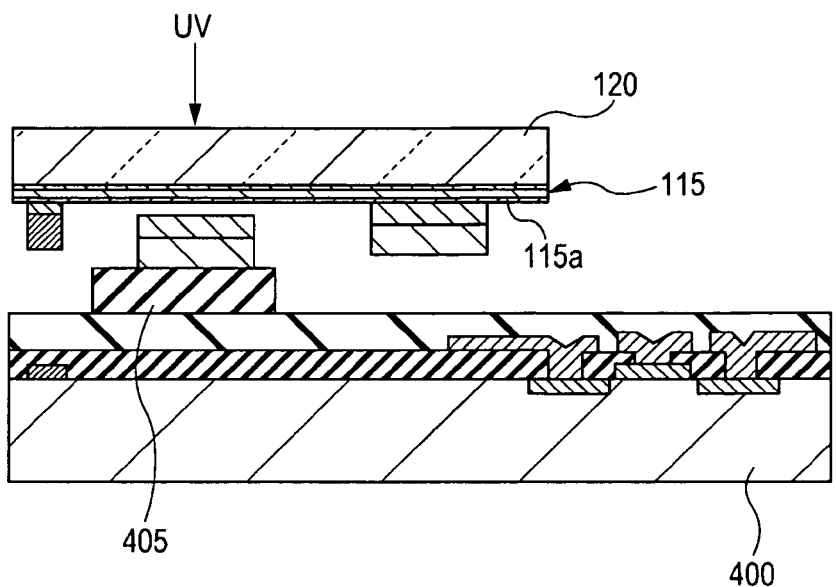
FIG. 9A is a view illustrating the step of transferring functional regions from segments of the second substrate shown in each of FIGS. 6A to 6C to another substrate.

Next, functional regions are transferred from the segments 120 bearing the groups each including a plurality of functional regions and obtained through the above-described steps onto another substrate. FIGS. 8A and 8B show a step of transferring functional regions from a segment 120 onto a silicon circuit substrate 400. FIG. 8A shows a step of transferring functional regions from the segments 120 onto respective portions on the silicon circuit substrate 400. An alignment region 319 on the silicon circuit substrate 400 is aligned with an alignment region 318 which has been transferred onto the segment 120, and a transfer is performed in this state. FIG. 8B and FIG. 9A are cross-sectional views showing a step of selectively transferring a functional region from the segment 120 onto a portion of the silicon circuit substrate 400.

Figure 9B:
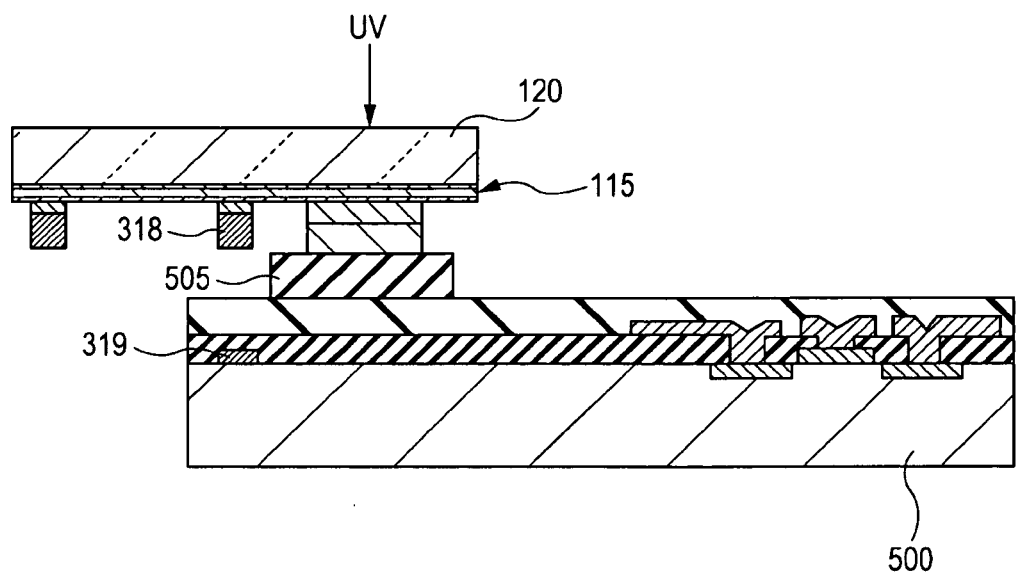
FIG. 9B is a view illustrating the step of transferring functional regions from segments of the second substrate shown in each of FIGS. 6A to 6C to another substrate.

Subsequently, as shown in FIG. 9B, a joining layer 505 having a predetermined thickness is formed on at least one of a second functional region remaining on the segment 120 and a region where the second functional region is to be transferred, the region being disposed on a substrate 500 (which may be another region of the above-mentioned substrate 400). The second functional region is joined to the substrate 500 with the joining layer 505 therebetween. The second functional region is separated from the segment 120 by treating a separation layer 115 under a predetermined condition. Also in this step, an alignment region 319 provided on the silicon circuit substrate 500 is aligned with an alignment region 318 which has been transferred on the segment 120, and a transfer is performed in this state.

Third Embodiment

A third embodiment according to a method for transferring functional regions will be described. The third embodiment differs from the first embodiment in the following point. In the first embodiment, alignment regions (alignment marks) are separately formed on both a seed substrate and a transfer destination substrate, and these two substrates are then overlapped using the alignment regions. In contrast, in the third embodiment, substrates are aligned and overlapped without using alignment regions (alignment marks). Accordingly, when a seed substrate and a transfer destination substrate are overlapped with each other, these substrates are aligned using, for example, edges of the two substrates without using alignment regions. Furthermore, alignment and overlapping of a divided segment and a transfer destination substrate are also performed with an alignment using edges of a functional region, a joining layer, and the like. Since an accurate alignment is not required in preparation of, for example, an LED group with a low degree of integration, even such an alignment can sufficiently achieve the purpose. Other configurations are the same as the first embodiment. Accordingly, the present embodiment will be also described with reference to FIGS. 10A to 13B in which components having the same functions as the first embodiment are assigned the same reference numerals as those in the drawings used in the description of the first embodiment. FIGS. 10A to 13B correspond to FIGS. 2A to 5B, respectively.

Figure 10A:
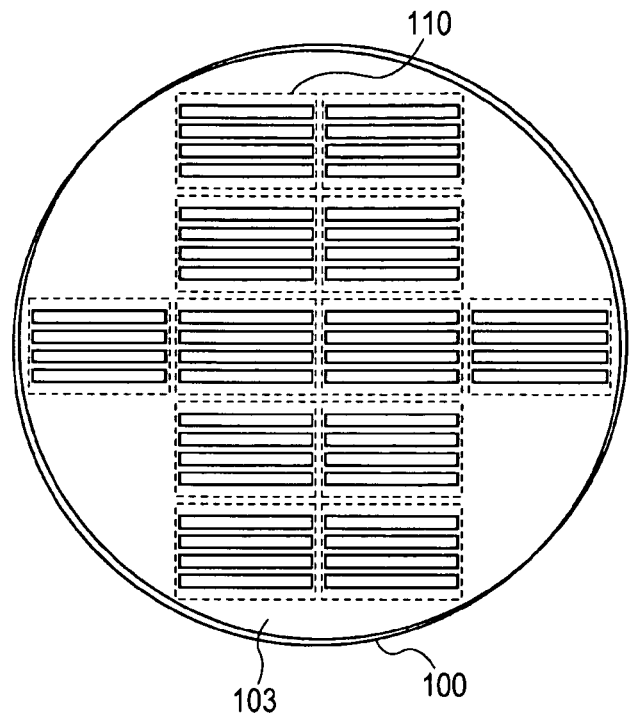
FIG. 10A is a view illustrating a step of aligning a first substrate and a second substrate which are used in a method for transferring functional regions according to another embodiment of the present invention and joining the substrates to each other.
Figure 10B:
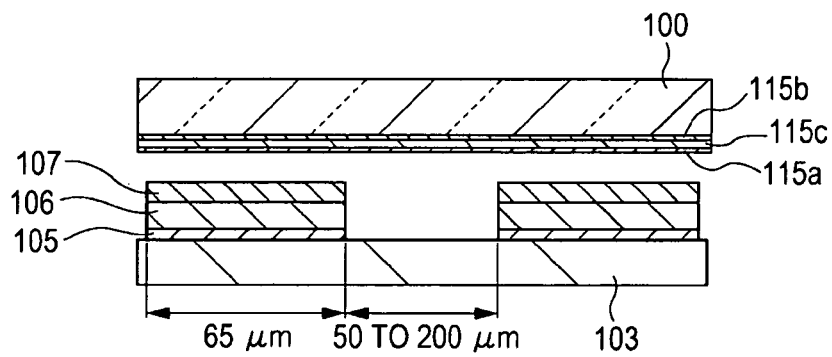
FIG. 10B is a view illustrating the step of aligning the first substrate and the second substrate which are used in the method according to the other embodiment of the present invention and joining the substrates to each other.
Figure 10C:
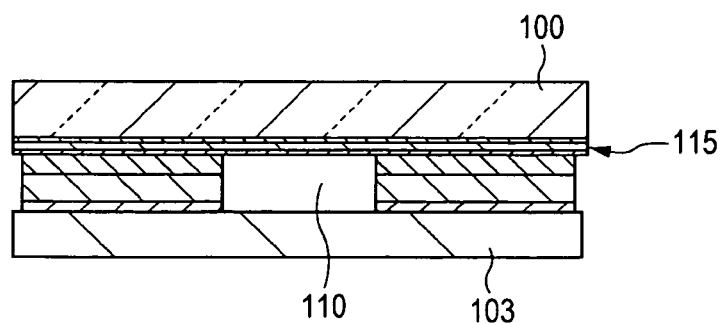
FIG. 10C is a view illustrating the step of aligning the first substrate and the second substrate which are used in the method according to the other embodiment of the present invention and joining the substrates to each other.

As shown in FIGS. 10A to 10C, in this embodiment, alignment regions (alignment marks) are not provided on a seed substrate 103 or a transfer destination substrate 100. Accordingly, when the seed substrate 103 and the transfer destination substrate 100 are overlapped with each other, the alignment is performed by aligning edges or the like of the two substrates.

Figure 11A:
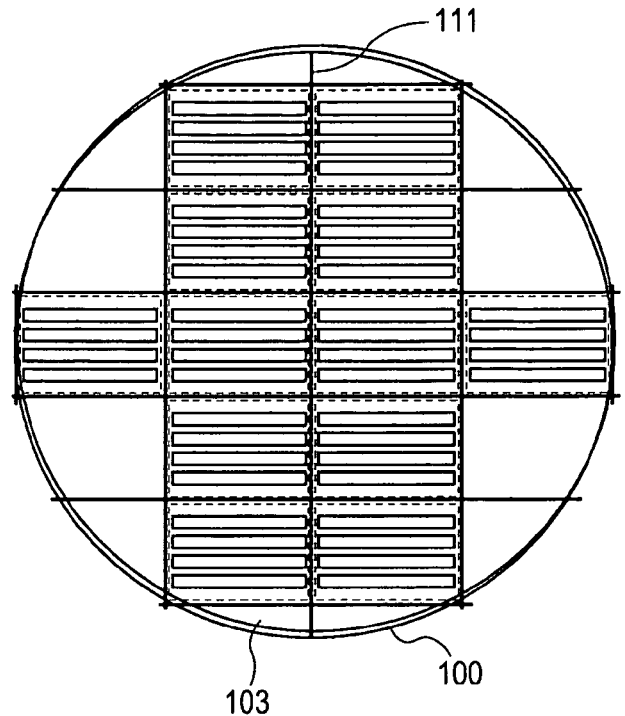
FIG. 11A is a view illustrating a step of providing separation grooves through the second substrate shown in each of FIGS. 10A to 10C and transferring functional regions from the first substrate to segments of the second substrate.
Figure 11B:
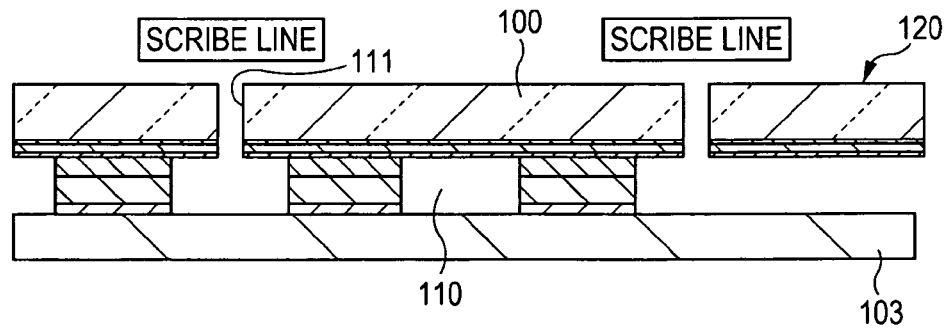
FIG. 11B is a view illustrating the step of providing separation grooves through the second substrate shown in each of FIGS. 10A to 10C and transferring functional regions from the first substrate to segments of the second substrate.
Figure 11C:
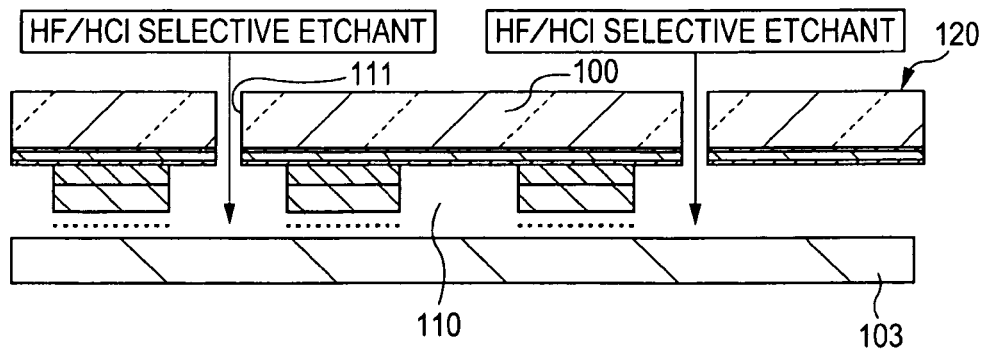
FIG. 11C is a view illustrating the step of providing separation grooves through the second substrate shown in each of FIGS. 10A to 10C and transferring functional regions from the first substrate to segments of the second substrate.

The transfer is performed as in the above-described embodiments, as shown in FIGS. 11A to 11C. Specifically, as shown in FIG. 11C, an etchant introduced through separation grooves 111 and interval regions 110 is brought into contact with an etching sacrificial layer 105 to etch the etching sacrificial layer 105. Thus, the compound semiconductor substrate 103 is separated from the composite member in which the seed substrate 103 and the glass substrate 100 are joined to each other. Thus, a plurality of segments 120 of the glass substrate 100, the segments 120 being provided with groups 101 and 102 of the functional regions, are prepared.

Figure 12A:
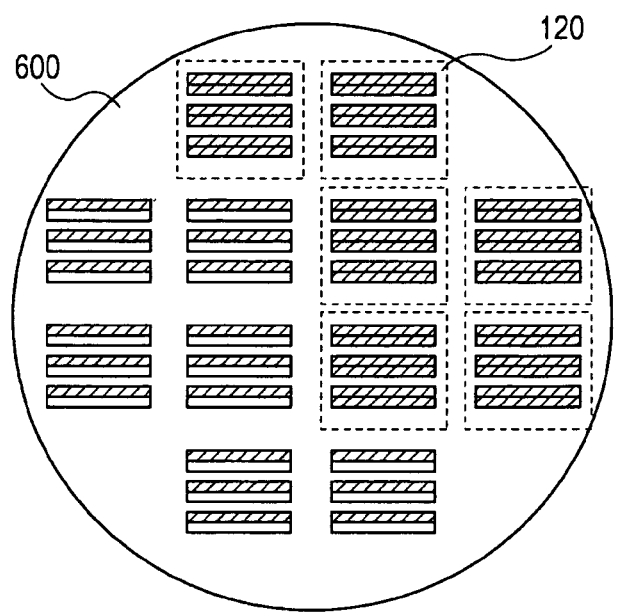
FIG. 12A is a view illustrating a step of transferring functional regions from segment of the second substrate shown in each of FIG. 10A to 10C to another substrate.
Figure 12B:
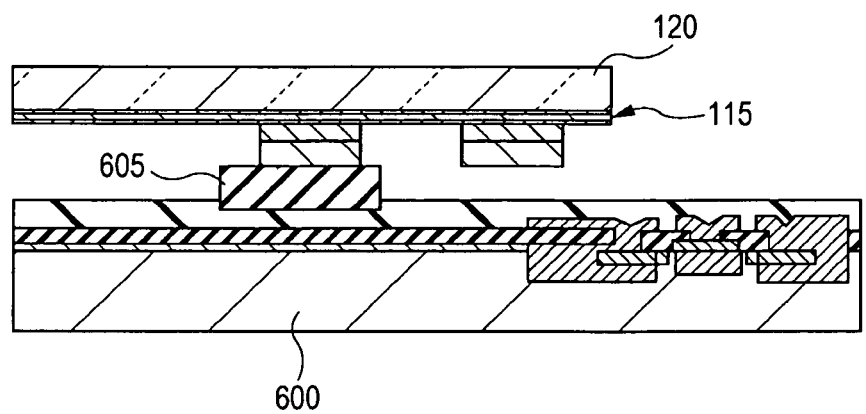
FIG. 12B is a view illustrating the step of transferring functional regions from segments of the second substrate shown in each of FIGS. 10A to 10C to another substrate.
Figure 13A:
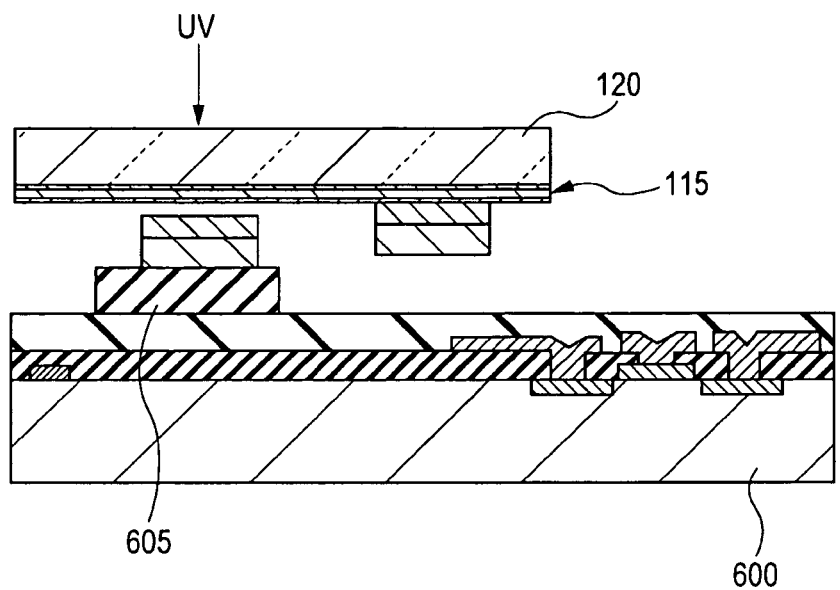
FIG. 13A is a view illustrating the step of transferring functional regions from segments of the second substrate shown in each of FIGS. 10A to 10C to another substrate.

A method for further transferring functional regions from the segments 120 bearing the groups each including a plurality of functional regions and obtained through the above-described steps to another substrate is also performed as in the above-described embodiments. FIGS. 12A and 12B show a step of transferring a functional region from a segment 120 onto a silicon circuit substrate 600. FIG. 12A shows a step of transferring functional regions from the segments 120 onto respective portions on the silicon circuit substrate 600. In this step, for example, alignment is performed by checking the relative position between an edge of a functional region on a segment 120 and an edge of a joining layer 605. FIG. 12B and FIG. 13A are cross-sectional views showing a step of selectively transferring a functional region from the segment 120 onto a portion of the silicon circuit substrate 600.

Figure 13B:
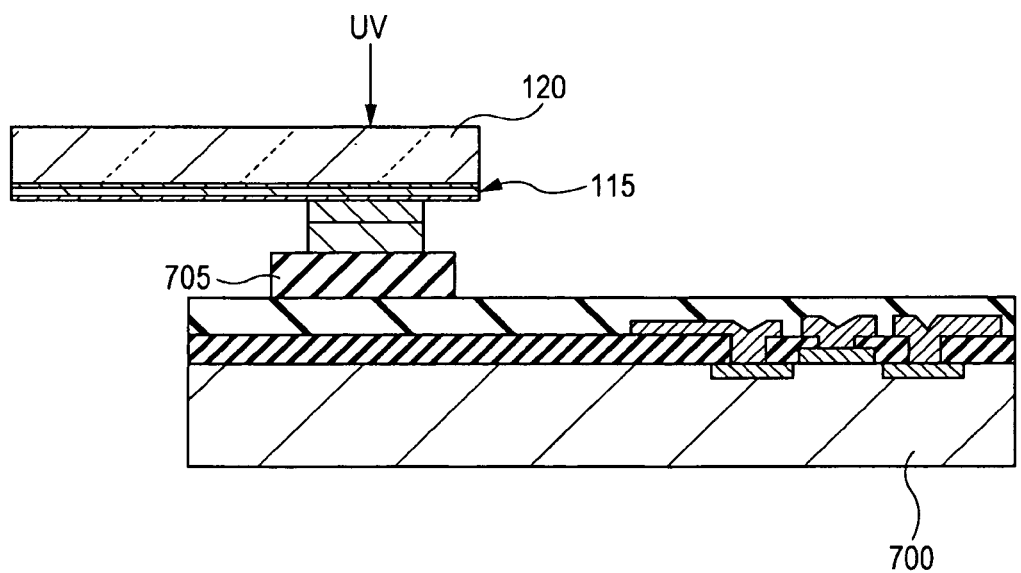
FIG. 13B is a view illustrating the step of transferring functional regions from segments of the second substrate shown in each of FIGS. 10A to 10C to another substrate.

Next, as shown in FIG. 13B, a joining layer 705 having a predetermined thickness is formed on at least one of a second functional region remaining on the segment 120 and a region where the second functional region is to be transferred, the region being disposed on a substrate 700 (which may be another region of the above-mentioned substrate 600). The second functional region is joined to the substrate 700 with the joining layer 705 therebetween. The second functional region is separated from the segment 120 by treating a separation layer 115 under a predetermined condition.

Fourth Embodiment

Figure 14:
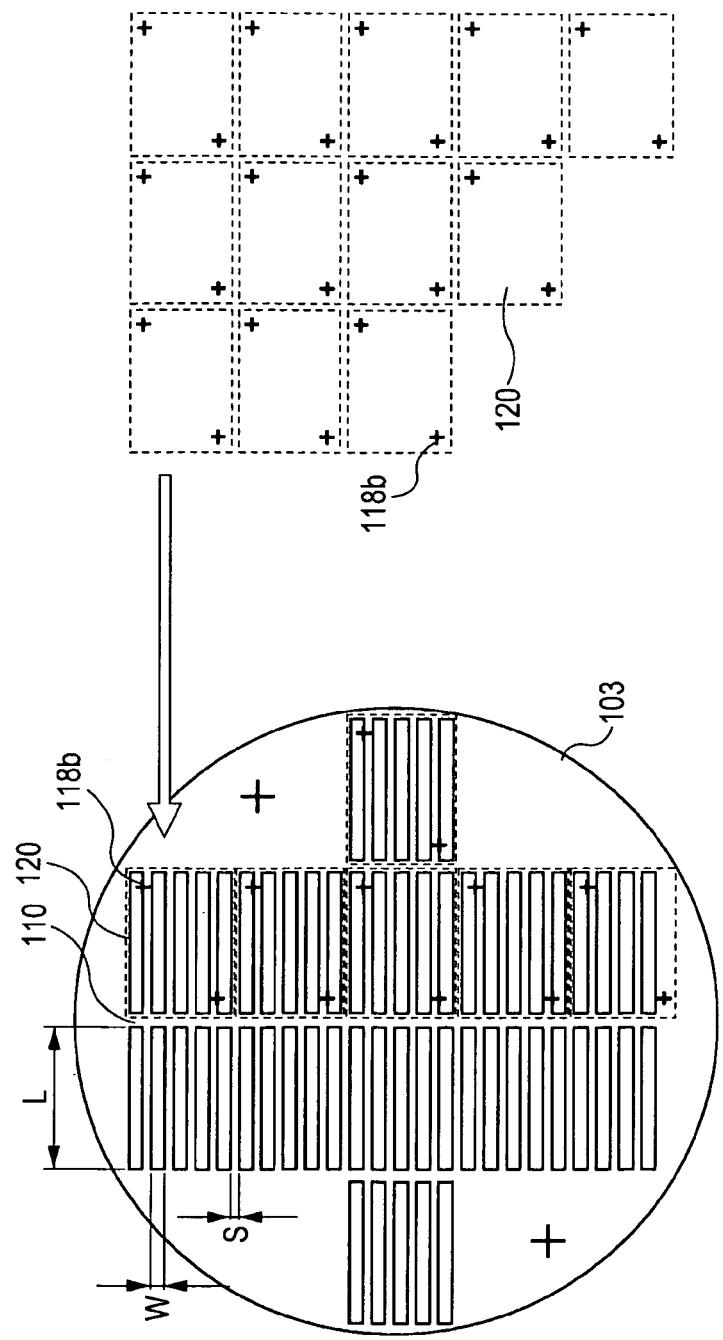
FIG. 14 includes plan views illustrating a method for reusing segments of a second substrate according to an embodiment.

A fourth embodiment relates to a method for reusing divided segments. For example, the segments 120 prepared in the first embodiment can be reused after all functional regions are transferred. For this purpose, the separation layer 115 which is a used double-sided release tape is peeled off, and a new separation layer is applied again. As shown in FIG. 14, the reproduced segments 120 are then arranged on an appropriate tray. Subsequently, a desired segment 120 is overlapped on a group including a plurality of functional regions prepared on a seed substrate 103 using alignment regions 118b. The subsequent steps are performed as described in the first embodiment. Also in this case, it is effective that a segment to be reused is arranged on the seed substrate and bonded thereto using a flip-chip bonder.

As described above, in this embodiment, segments 120 of a second substrate, the segments 120 being separated from each other by separation grooves, are reused as a second substrate after functional regions on the segments 120 are transferred onto another substrate, the second separation layer is removed, and a new second separation layer is provided. According to this embodiment, separation grooves 111 need not be formed, and functional regions can be transferred onto the segments 120 through the same steps as in the embodiments described above.

In the transfer methods described in the above embodiments, for example, in the case where LEDs are produced, the following compound semiconductor multilayer film (functional region) is formed. A p-AlAs layer (etching sacrificial layer) is formed on a p-type GaAs substrate (seed substrate), and the following layers are formed thereon as the compound semiconductor multilayer film. Specifically, a p-type GaAs contact layer, a p-type AlGaAs cladding layer, a p-type AlGaAs active layer, an n-type AlGaAs cladding layer, and an n-type GaAs contact layer are formed. An AlInGaP layer may be formed as an etching stop layer between the sacrificial layer and the compound semiconductor substrate. In the case where GaAs layers and AlGaAs layers are etched with sulfuric acid, the etching is stopped by the AlInGaP layer. The AlInGaP layer is then removed with hydrochloric acid. In the case where GaAs layers and AlGaAs layers are etched with an ammonia and hydrogen peroxide mixture, an AlAs layer may be used as an etching stop layer.

Compound semiconductor materials other than GaAs-based materials, for example, AlGaInP-based materials, InGaAsP-based materials, GaN-based materials, AlGaN-based materials, and InAlGaN-based materials may also be used as the material for the compound semiconductor multilayer film.

Furthermore, at least one of a metal film and a distributed Bragg reflector (DBR) mirror may be provided on the compound semiconductor multilayer film. Here, the metal film refers to a film composed of a metal such as Au, Ti, or Al. The materials for the metal film are selected in accordance with the emission wavelength of LEDs. For example, when red LEDs that emit light in the range of 700 to 800 nm are made, Au, Ag, or the like has a high reflectivity. When blue LEDs that emit light of about 360 nm are made, Al may be used as the metal film.

When, for example, GaAs-based compound semiconductor materials are used, the DBR mirror is constituted by alternately stacking AlAs layers and AlGaAs layers a plurality of times. Alternatively, the DBR mirror is constituted by alternately stacking aluminum oxide layers and $Al_{0.2}Ga_{0.8}As$ layers. Since it is difficult to form an aluminum oxide film by epitaxial growth, in reality, the refractive index may be controlled by, for example, using $Al_xGa_{1-x}As$ and alternately changing the value of x between 0.2 and 0.8.

Furthermore, when an LED device is formed using a compound semiconductor multilayer film, a homojunction LED can be constituted instead of a heterojunction LED. In such a case, after each layer is epitaxially grown, an impurity is diffused by a solid-phase diffusion method to form a p-n junction in an active layer. In order to establish an ohmic contact between a contact layer and a p-side electrode or an n-side electrode, the contact layer may have an impurity concentration higher than that of cladding layers sandwiching the active layer.

Also in the above specific embodiment, functional regions which have been transferred from a seed substrate onto a segment as described above are transferred onto another substrate using a joining layer and a separation layer either selectively or at one time.

Fifth Embodiment

Figure 16:
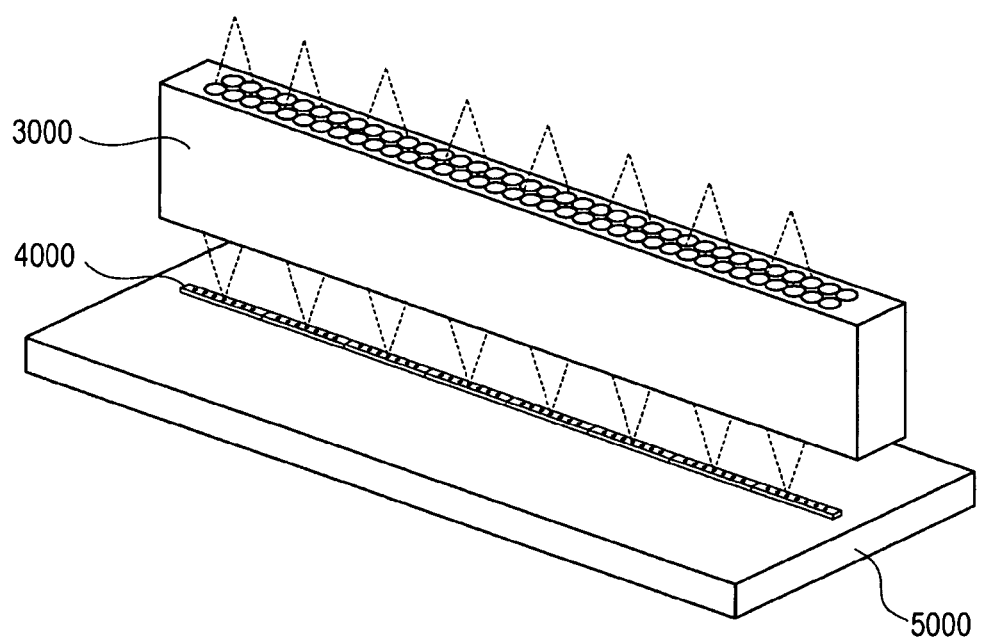
FIG. 16 is a perspective view of an LED printer head according to an embodiment of the present invention.

A description will be made of a fifth embodiment according to an LED array manufactured by the above-described method for transferring functional regions. LED arrays shown in FIG. 16 are provided by employing a transfer method described in any of the above embodiments. FIG. 16 is a perspective view showing an example of the structure in which LED arrays and driver circuits (driver ICs) 4000 (LED arrays/driver circuits 4000) are connected to and arranged on a printed circuit board 5000. The LED arrays and driver circuits are obtained by forming a plurality of LED devices on the silicon substrate 200 shown in FIG. 15 by the above-described method for transferring semiconductor articles, and aligning a plurality of silicon substrate segments prepared by dividing the silicon substrate 200 by dicing. The cross-sectional structures of each of the LED devices and driver circuits are the same as those of an LED device including an LED light-emitting region and a driver circuit shown in FIG. 17 described below.

Figure 17:
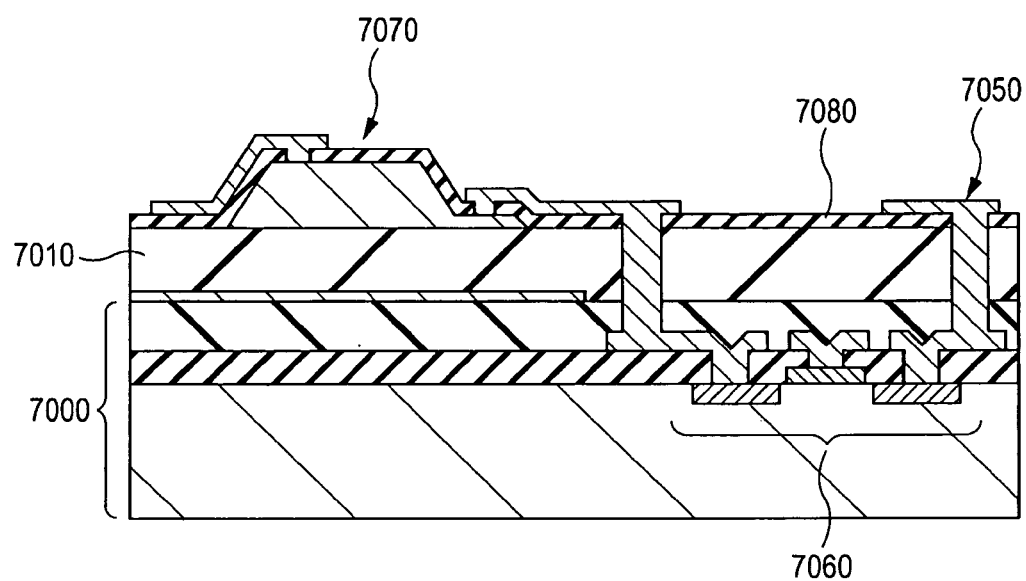
FIG. 17 is a cross-sectional view showing a structure in which a driver circuit is formed directly on the Si substrate side and is connected to an LED device.

In the structure shown in FIG. 16, a plurality of LED arrays/driver circuits 4000 are linearly aligned on the printed circuit board 5000. Each of the LED devices and a corresponding driver element of the driver ICs in the LED arrays/driver circuits 4000 are electrically connected to each other, as shown in FIG. 17. An LED printer head can be produced by mounting a rod lens array (e.g., selfoc lens array (SLA)) 3000 on the linearly aligned LED arrays 4000, as required. Light emitted from the linearly aligned LED arrays 4000 is focused by the rod lens array 3000 to achieve LED-array imaging. The alignment form of the LED arrays is not limited to a linear shape. For example, an alignment form such as a staggered alignment, i.e., a zigzag alignment may be used. The alignment form can be determined according to the intended use.

In the case where an LED device-constituting layer is provided on a silicon substrate with a metal film or a DBR mirror therebetween, a very small spot size is realized by improving the directivity of the light emitted from the resulting device. Thus, an LED printer head not having a rod lens array can also be produced.

As shown in FIG. 17, as for the form for connecting a driver IC (driver circuit) to an LED device, the driver IC may be formed directly on the silicon substrate side and may be connected to the LED device. In the structure shown in FIG. 17, an insulating film 7010 (refer to, for example, the joining layer 205 shown in FIG. 4B) composed of an organic material is provided on a silicon substrate 7000 including a MOS transistor 7060 constituting the driver IC. An LED light-emitting region 7070 composed of a compound semiconductor multilayer film is provided on the insulating film 7010. Referring to FIG. 17, an insulating film 7080 is provided above the MOS transistor 7060, and a wire bonding pad 7050 functions as a source or drain region of the MOS transistor 7060. This structure can be produced from, for example, the structure of the substrate 200 shown in FIGS. 4A and 4B.

Figure 18:
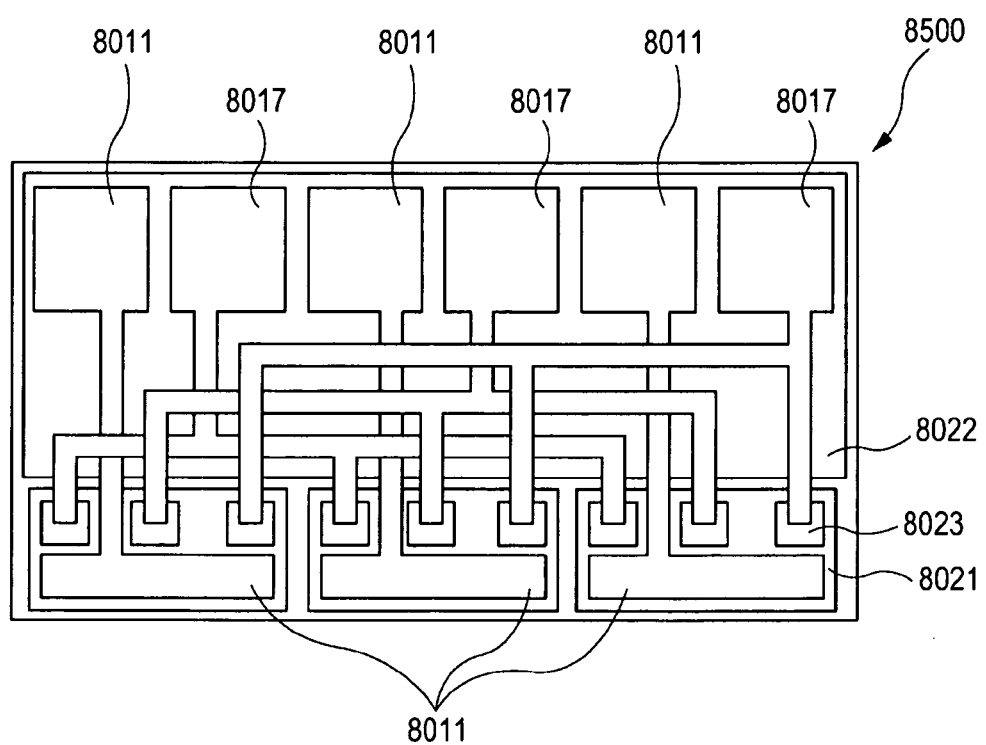
FIG. 18 is a plan view of a light-emitting device array circuit that can be subjected to a time-sharing driving for reducing the number of electrodes.

An example of a case of a matrix driving is shown in FIG. 18. FIG. 18 shows a light-emitting device array circuit 8500 that can be subjected to a time-sharing driving for reducing the number of electrodes. Referring to FIG. 18, the light-emitting device array circuit 8500 includes n-side electrodes 8011, p-side electrodes 8017, an insulating film 8021 provided on an n-type AlGaAs layer, an insulating film 8022 provided on a p-type GaAs contact layer, and light-emitting regions 8023. The above-described high-performance LED array and LED printer head can be provided at a low cost by employing the method for transferring functional regions of the present invention.

Sixth Embodiment

Figure 19A:
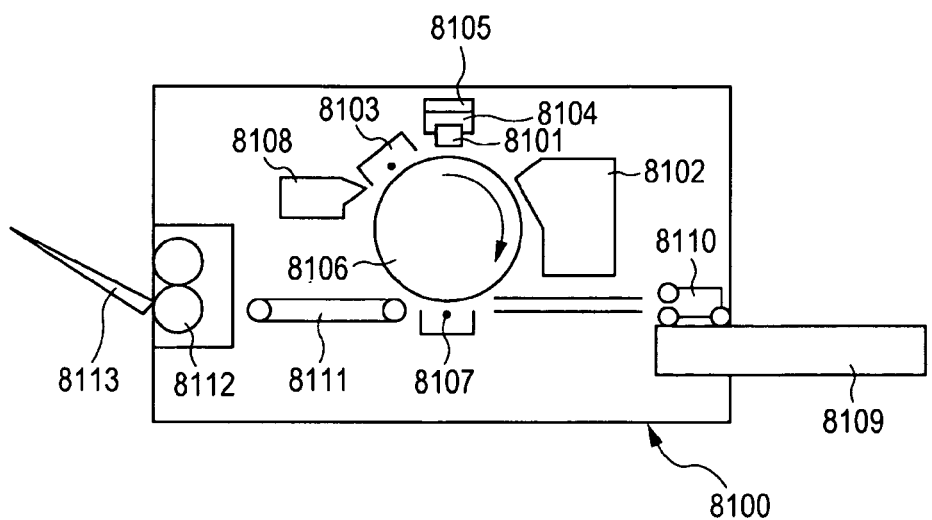
FIG. 19A is a conceptual view showing an example of the structure of an LED printer according to an embodiment.

FIG. 19A shows an example of an LED printer including the LED printer head described in the fifth embodiment. This LED printer is provided with the LED printer head described above, a photosensitive drum, and a charger and includes an imaging unit configured to write an electrostatic latent image on the photosensitive drum using the LED printer head as a light source.

Referring to FIG. 19A, which is a schematic cross-sectional view showing an example of the structure of an LED printer, a photosensitive drum 8106 that rotates in the clockwise direction is accommodated in a printer main body 8100. The photo-sensitive drum 8106 extends in the direction perpendicular to the paper surface of the drawing. An LED printer head 8104 extending in the same direction and configured to expose the photosensitive drum 8106 is provided above the photosensitive drum 8106. The LED printer head 8104 is constituted by an LED array 8105 in which a plurality of light-emitting diodes that emit light in accordance with image signals are arranged and a rod lens array 8101 which forms an image of a light-emitting pattern of the light-emitting diodes on the photosensitive drum 8106. Here, the rod lens array 8101 has the structure described in the fifth embodiment. The imaging surface of the light-emitting diodes is configured to coincide with the position of the photosensitive drum 8106 by the rod lens array 8101. That is, the light-emitting surface of the light-emitting diodes is configured to have an optically conjugated relationship with the photosensitive surface of the photosensitive drum 8106 by the rod lens array 8101.

A charger 8103 that uniformly charges the surface of the photosensitive drum 8106 and a developing device 8102 that allows toner particles to adhere to the photosensitive drum 8106 in accordance with a pattern exposed by the LED printer head 8104 to form a toner image are provided around the photosensitive drum 8106. Furthermore, a transfer charger 8107 that transfers a toner image formed on the photosensitive drum 8106 onto a transfer material (not shown) such as copy paper and a cleaning unit 8108 that recovers toner particles remaining on the photosensitive drum 8106 after the transfer are also provided around the photosensitive drum 8106.

Furthermore, a paper cassette 8109 that loads the transfer material and a paper feeding unit 8110 that supplies the transfer material in the paper cassette 8109 between the photosensitive drum 8106 and the transfer charger 8107 are provided in the printer main body 8100. In addition, a fixing device 8112 configured to fix the transferred toner image onto the transfer material, a transport unit 8111 that guides the transfer material to the fixing device 8112, and a paper output tray 8113 that holds the transfer material discharged after fixing are provided.

Figure 19B:
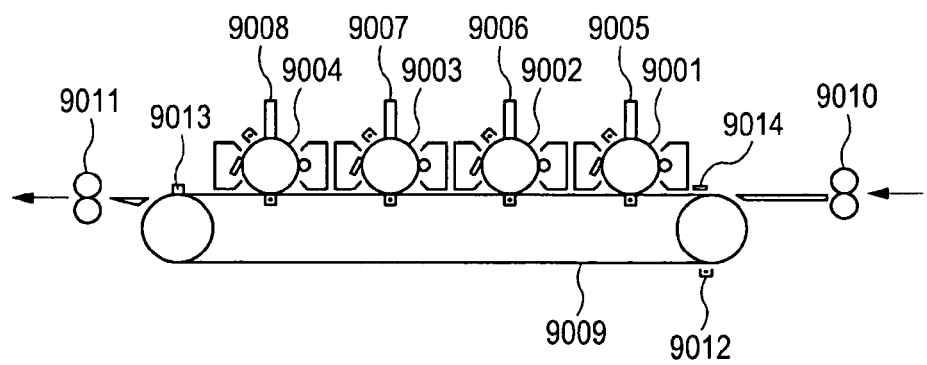
FIG. 19B is a conceptual view showing an example of the structure of a color printer according to an embodiment.
Figure 20A:
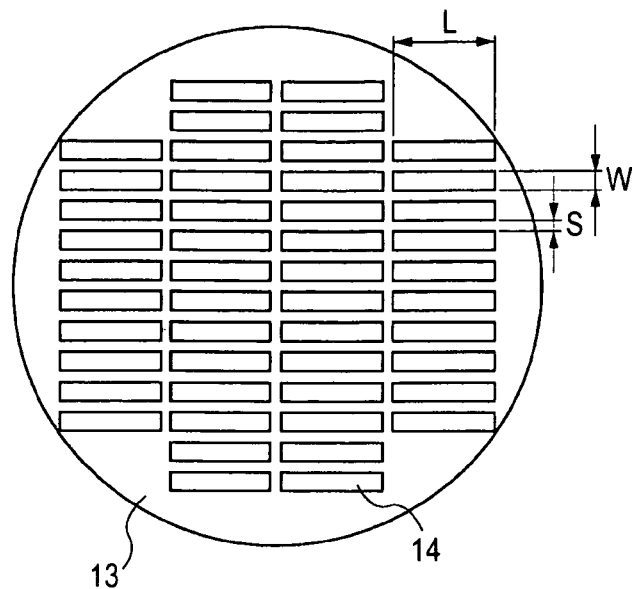
FIG. 20A is a plan view illustrating a plurality of regions to which a plurality of functional regions are to be transferred, the regions being provided on a substrate, according to an example in the related art.
Figure 20B:
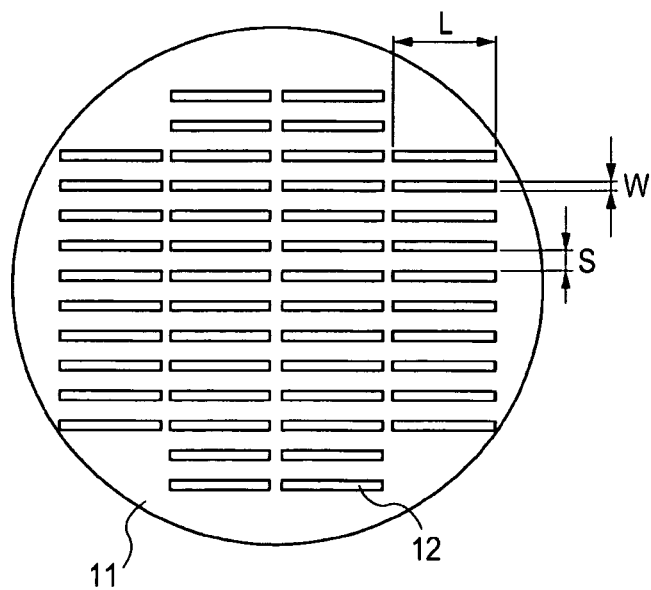
FIG. 20B is a plan view illustrating the functional regions formed on a seed substrate in the example in the related art.

Next, a description will be made of a color LED printer that includes the LED printer heads, the photosensitive drums, and the charger described above, and that is provided with a plurality of imaging units each configured to write an electrostatic latent image on one of the photosensitive drums using a corresponding LED printer head as a light source. FIG. 19B shows a schematic structure of a mechanical portion of an example of a color LED printer. Referring to FIG. 19B, the color LED printer includes a magenta (M) photosensitive drum 9001, a cyan (C) photosensitive drum 9002, a yellow (Y) photosensitive drum 9003, a black (K) photosensitive drum 9004, and LED printer heads 9005, 9006, 9007, and 9008 for these colors, respectively. A transport belt 9009 transports transfer paper and brings the transfer paper into contact with the photo-sensitive drums 9001, 9002, 9003, and 9004. The color LED printer further includes a registration roller 9010 for paper feeding and a fixing roller 9011. In addition, the color LED printer includes a charger 9012 configured to hold transfer paper on the transport belt 9009 by absorption, a destaticizing charger 9013, and a sensor 9014 configured to detect an edge of transfer paper.

By employing the method for transferring functional regions of the present invention, a seed substrate such as a GaAs substrate can be effectively used and reused, a problem caused by the difference in size between transfer substrates can be eliminated by using segments that mediates a transfer, and the functional regions can be reliably transferred either electively or at one time. Accordingly, a high-performance LED array, LED printer head, LED printer, and the like can be provided at a low cost.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-050012, filed Mar. 4, 2009, which is hereby incorporated by reference herein in its entirety.

The invention claimed is:

1. A method for transferring a functional region from a first substrate to a second substrate,
   wherein a first separation layer which becomes separable by a treatment is disposed between the first substrate and the functional region, and a second separation layer that becomes separable by a treatment is disposed in a region on the second substrate where the functional region is to be transferred, and
   wherein a plurality of groups, each of which includes a plurality of functional regions, are formed on the first substrate and a plurality of segments, each of which corresponds to the respective group, are formed on the second substrate, the method comprising:
   a first step of joining the first substrate to the second substrate by bonding such that the functional regions are in contact with the second separation layer;
   a second step of separating the functional regions from the first substrate at the first separation layer; and
   a third step of, before or after the second step, forming separation grooves penetrating through the second substrate and the second separation layer from a surface of the second substrate, the surface being opposite to a surface having the second separation layer thereon, so that the separation grooves separate the second substrate into the plurality of segments after the second step.

2. The method according to claim 1,
   wherein, in the third step, the separation grooves are formed in a state in which the first substrate is joined to the second substrate, and
in the second step, the functional regions are separated from the first substrate by at least removing the first separation layer with an etchant introduced through the separation grooves.

3. The method according to claim 1,
   wherein a plurality of the functional regions are arranged on the first substrate with predetermined interval regions therebetween, and
the separation grooves provided through the second substrate are formed at positions corresponding to at least a part of the interval regions disposed between the functional regions.

4. The method according to claim 1,
   wherein an alignment region is provided on the first separation layer of the first substrate, and
   in the second step, when the functional regions are transferred from the first substrate onto the second substrate, the alignment region is also transferred onto the second substrate.

5. The method according to claim 1,
   wherein an alignment region is provided on the first substrate, and
an alignment region corresponding to the alignment region on the first substrate is provided on the second substrate.

6. The method according to claim 1, wherein, in transferring the functional regions, a joining position is determined using, as an alignment region, at least one of the functional regions, a joining layer that joins the functional regions to a substrate, and the separation layers.

7. The method according to claim 1, wherein segments of the second substrate separated from each other by the separation grooves in the third step are reused as the second substrate after functional regions on the segments are transferred onto another substrate, the second separation layer is removed, and a new second separation layer is formed.

8. An LED array comprising:
   LEDs including a light-emitting layer serving as functional regions; and
   circuits that drive the LEDs and that are electrically connected to the functional regions,
   the LED array being produced by transferring the functional regions by the method according to claim 1.

9. An LED printer head comprising:
   the LED array according to claim 8; and
   a rod lens array mounted on the LED array.

10. An LED printer comprising:
    an LED printer head including the LED array according to claim 8 or the LED printer head according to claim 9;
    a photosensitive member;
    a charger; and
    an imaging unit configured to write an electrostatic latent image on the photosensitive member using the LED printer head as a light source.

11. A color LED printer comprising:
    LED printer heads each including the LED array according to claim 8 or the LED printer heads according to claim 9;
    photosensitive members;
    a charger; and
    a plurality of imaging units each configured to write an electrostatic latent image on one of the photosensitive members using a corresponding LED printer head as a light source.

* * * * *